(12) United States Patent
Fujisawa

(10) Patent No.: US 6,716,731 B2
(45) Date of Patent: Apr. 6, 2004

(54) SEMICONDUCTOR DEVICE AND METHOD FOR REDUCING CONTACT RESISTANCE BETWEEN AN ELECTRODE AND A SEMICONDUCTOR SUBSTRATE

(75) Inventor: Masahiko Fujisawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/838,227

(22) Filed: Apr. 20, 2001

(65) Prior Publication Data

US 2001/0015436 A1 Aug. 23, 2001

Related U.S. Application Data

(62) Division of application No. 09/305,283, filed on May 5, 1999, now Pat. No. 6,236,090.

(30) Foreign Application Priority Data

Nov. 27, 1998 (JP) .......................................... P10-337297

(51) Int. Cl.⁷ ................. H01L 21/3205; H01L 21/4763; H01L 21/44
(52) U.S. Cl. ....................... 438/586; 438/655; 438/660; 438/664; 438/683
(58) Field of Search ................................ 438/586, 655, 438/664, 683, 660, 682

(56) References Cited

U.S. PATENT DOCUMENTS

| 5,217,923 A | * | 6/1993 | Suguro | ........................ 438/305 |
| 5,915,197 A | * | 6/1999 | Yamanaka et al. | .......... 438/586 |
| 6,136,699 A | * | 10/2000 | Inoue | ......................... 438/656 |
| 6,162,689 A | * | 12/2000 | Kepler et al. | ................ 438/299 |

FOREIGN PATENT DOCUMENTS

| JP | 03-280532 | * | 12/1991 | ........... H01L/21/28 |
| JP | 08-191053 | * | 7/1996 | ........... H01L/21/28 |
| JP | 09-115860 | * | 5/1997 | ......... H01L/21/285 |

OTHER PUBLICATIONS

Wolf et al., "Refractory Metals and Their Silicides in VLSI Fabrication," Silicon Processing for the VLSI Era—vol. 1: Process Technology, Lattice Press (1986), pp. 397–399.*

* cited by examiner

Primary Examiner—Amir Zarabian
Assistant Examiner—Toniae M Thomas
(74) Attorney, Agent, or Firm—Oblon, Spivak, McClelland, Maier & Neustadt, P.C.

(57) ABSTRACT

A main electrode is connected to an n-type semiconductor layer selectively formed on a major surface of a silicon substrate. A silicide layer is interposed between the main electrode and the semiconductor layer. The silicide layer is heat-treated at 600° C. to 850° C. for at least 30 minutes, to have an epitaxial layer selectively epitaxially growing in a specific direction such as the <110> direction toward the semiconductor layer. Therefore, irregularities are formed on the interface between the suicide layer and the semiconductor layer. The interface resistivity between the silicide layer and the semiconductor layer is low due to the presence of the epitaxial layer, and besides the contact area of the interface is large due to the irregularities of the interface. Consequently, the contact resistance between the main electrode and the semiconductor layer is effectively reduced. Thus, the contact resistance between the main electrode and the semiconductor substrate is reduced.

8 Claims, 21 Drawing Sheets

F I G . 3 7
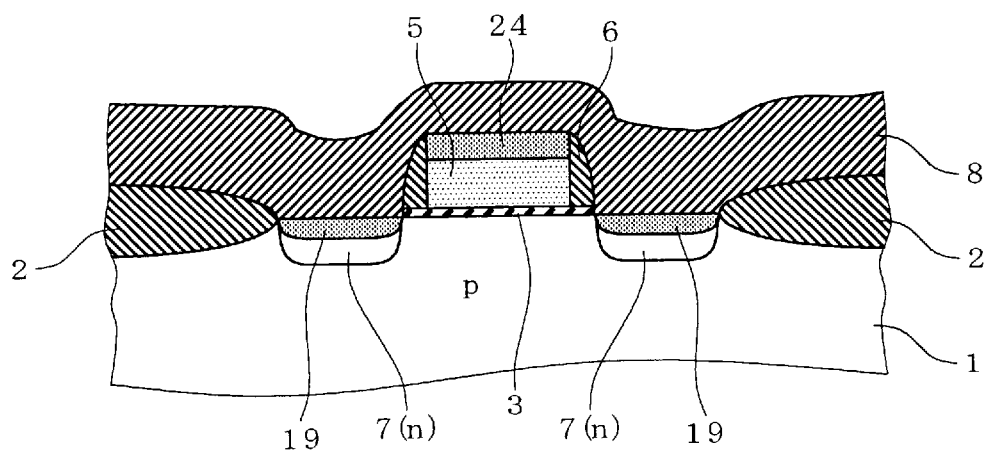
F I G . 3 8
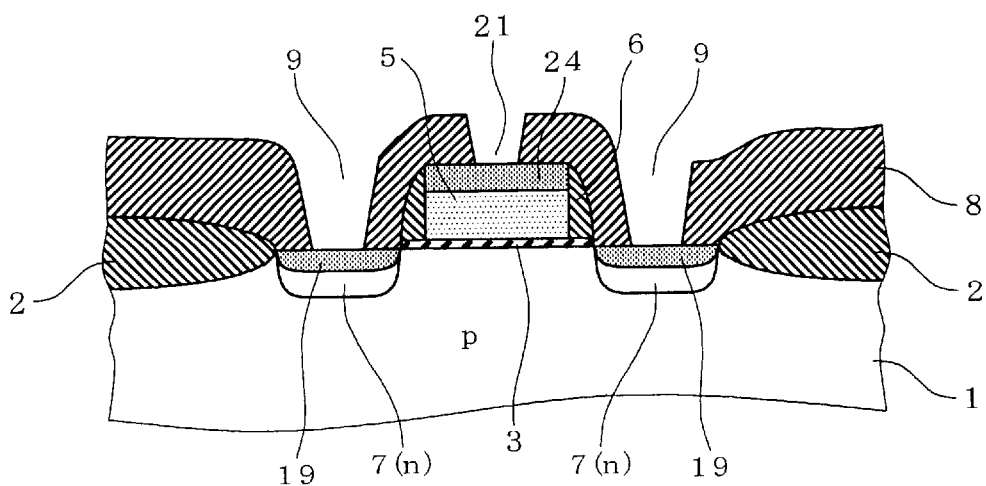

SEMICONDUCTOR DEVICE AND METHOD FOR REDUCING CONTACT RESISTANCE BETWEEN AN ELECTRODE AND A SEMICONDUCTOR SUBSTRATE

CROSS REFERENCE TO RELATED APPLICATION

The present document claims the benefit of the earlier filing date of and is a division of co-pending U.S. patent application Ser. No. 09/305,283, entitled "SEMICONDUCTOR DEVICE AND METHOD OF MANUFACTURING THE SAME" filed in the U.S. Patent and Trademark Office on May 5, 1999, now U.S. Pat. No. 6,236,090, and claims priority to Japanese Application Number 10-337297, filed Nov. 27, 1998, the entire contents of which being incorporated herein by reference.

BACKGROUND OF THE INVENTION

1. Field of the Invention

The present invention relates to a semiconductor device and a method of manufacturing the same, and more particularly, it relates to an improvement for reducing contact resistance between an electrode and a semiconductor substrate.

2. Description of the Background Art

FIG. 42 is a front sectional view showing the structure of a conventional semiconductor device 151 forming the background of the present invention. The conventional semiconductor device 151 comprises a MOSFET (metal oxide semiconductor field-effect transistor) on a major surface of a silicon semiconductor substrate 51. Throughout the specification, an insulated gate FET having a non-metal gate electrode is also referred to as a MOSFET, according to the custom in the related field.

A pair of n-type semiconductor layers 57 are selectively formed in the major surface of the semiconductor substrate 51 exposing a p-type semiconductor layer in a region enclosed with a pair of element isolation layers 52. The surface layer part of the major surface of the semiconductor substrate 51 enclosed with the pair of semiconductor layers 57 corresponds to a channel region CH of the MOSFET. The semiconductor layers 57 correspond to source/drain regions of the MOSFET. An insulator film 53 is formed on the major surface of the semiconductor substrate 51, and a gate electrode 55 is formed on the insulator film 53 to be opposed to the channel region CH. Side surfaces of the gate electrode 55 are covered with insulating side walls 56.

An insulator layer 58 is formed to entirely cover the aforementioned structure formed over the semiconductor substrate 51. In this insulator layer 58, a pair of contact holes 59 are selectively formed on positions located immediately above the pair of semiconductor layers 57, while a contact hole 71 is selectively formed on a position located immediately above the gate electrode 55.

The contact holes 59 are charged with conductive main electrodes 64 through a barrier layer 62. Consequently, the pair of main electrodes 64 are connected to the pair of semiconductor layers 57. Similarly, the contact hole 71 is charged with a conductive gate wire 72 through the barrier layer 62. Consequently, the gate wire 72 is connected to the gate electrode 55.

As understood from FIG. 43 showing a part J of FIG. 42 in an enlarged manner, silicide layers 63 are formed on the interfaces between the barrier layer 62 and the semiconductor layers 57 and that between the barrier layer 62 and the gate electrode 55 respectively. Thus, the semiconductor device 151 has the silicide layers 63 interposed between the main electrodes 64 and the semiconductor layers 57 and between the gate wire 72 and the gate electrode 55, for suppressing contact resistance therebetween.

The contact resistance between each main electrode 64 and each semiconductor layer 57 is given by the total sum of the resistance of the main electrode 64, the interface resistance between the main electrode 64 and the barrier layer 62, the resistance of the barrier layer 62, the interface resistance between the barrier layer 62 and the silicide layer 63, the resistance of the silicide layer 63 and the interface resistance between the silicide layer 63 and the semiconductor layer 57. Among these resistance elements, the interface resistance between the silicide layer 63 and the semiconductor layer 57 is the maximum. Therefore, the interface resistance between the silicide layer 63 and the semiconductor layer 57 dominates the contact resistance between the main electrode 64 and the semiconductor layer 57.

The interface resistance R between the silicide layer 63 and the semiconductor layer 57 is expressed as follows:

$$R = \rho/SA \quad (1)$$

where $\rho$ represents the interface resistivity between the silicide layer 63 and the semiconductor layer 57 and SA represents the contact area on the interface between the silicide layer 63 and the semiconductor layer 57.

Following recent refinement of the semiconductor device, the diameter of the contact hole 59 tends to be reduced. Consequently, the contact area SA is reduced, to increase the interface resistance R. Since the diameter of the contact hole 71 also tends to be reduced, the contact resistance between the gate wire 72 and the gate electrode 55 is also increased similarly to that between the main electrode 64 and the semiconductor layer 57. However, the increase of the contact resistance between the main electrode 64 feeding a main current and the semiconductor layer 57 is more significant.

In order to reduce the interface resistance R, two countermeasures for reducing the interface resistivity $\rho$ and enlarging the contact area SA are assumable from the expression (1). Prior Art noting each of these countermeasures is known in the art.

Each of Japanese Patent Laying-Open Gazettes Nos. 8-191053 (1996) and 9-115860 (1997) discloses a technique employing silicide epitaxially growing toward a silicon substrate. On a general interface between silicide and silicon, a number of defects are present due to mismatching in crystal structure. Consequently, the defects cause scattering when carriers pass through the interface, to increase the interface resistivity $\rho$.

On the other hand, the interface resistivity $\rho$ is reduced on the interface between silicide epitaxially growing on a silicon substrate and silicon, due to a small amount of crystal defects. In other words, the prior art disclosed in each of the aforementioned gazettes achieves reduction of the interface resistivity $\rho$. In the prior art, however, the contact area SA cannot be enlarged.

Japanese Patent Laying-Open Gazette No. 3-280532 (1991) discloses a technique of reducing the contact resistance between an electrode and a semiconductor substrate by forming fine irregularities on the bottom portion of a contact hole. According to this technique, the contact area SA can be enlarged without increasing the diameter of the contact hole. However, the interface resistivity $\rho$ cannot be reduced.

While either the interface resistivity $\rho$ or the contact area SA can be improved in the prior art as described above, no technique of effectively reducing the contact resistance between an electrode and a semiconductor substrate by improving both these elements has been known in the art.

SUMMARY OF THE INVENTION

According to a first aspect of the present invention, a semiconductor device comprises a semiconductor substrate having a major surface, an electrode formed on the semiconductor substrate, and a metal semiconductor compound layer interposed between the electrode and the semiconductor substrate and provided with an epitaxial growth layer at least partially inclined against the major surface.

In the semiconductor device according to the first aspect of the present invention, the metal semiconductor compound layer interposed between the electrode and the semiconductor substrate has the epitaxial growth layer at least partially inclined against the major surface of the semiconductor substrate, whereby the area of the interface between the epitaxial growth layer and the semiconductor substrate is enlarged and the interface resistivity is reduced. Therefore, the contact resistance between the electrode and the semiconductor substrate is effectively reduced.

According to a second aspect of the present invention, the semiconductor substrate comprises a semiconductor layer selectively formed in the major surface and containing an impurity, the semiconductor device further comprises an insulator layer formed on the major surface, the insulator layer defines a contact hole selectively opening on the semiconductor layer, the electrode is embedded in the contact hole and connected to the semiconductor layer, a main part of the metal semiconductor compound layer is formed only in a region of the major surface located immediately under the contact hole, and the semiconductor substrate further comprises another semiconductor layer identical in conductivity type to the semiconductor layer, deeper than the semiconductor layer and selectively formed in the major surface to cover the region of the major surface located immediately under the contact hole.

In the semiconductor device according to the second aspect of the present invention, at least the main part of the metal semiconductor compound layer is formed only in the region located immediately under the contact hole, whereby the metal semiconductor compound layer can be formed through a simple step of forming a metal film on the bottom portion of the contact hole and performing a heat treatment. Further, the semiconductor device comprises another semiconductor layer, whereby sufficient distances can be ensured between the epitaxial growth layer and edge portions of the semiconductor layers even if the semiconductor layer is shallowly formed. Therefore, refinement of the semiconductor device can be attained while suppressing a leakage current.

According to a third aspect of the present invention, the semiconductor substrate comprises a semiconductor layer selectively formed in the major surface and containing an impurity, the semiconductor device further comprises an insulator layer formed on the major surface, the insulator layer defines a contact hole selectively opening on the semiconductor layer, the electrode is embedded in the contact hole and connected to the semiconductor layer, a main part of the metal semiconductor compound layer is formed only in a region of the major surface located immediately under the contact hole, the semiconductor substrate further comprises an element isolation layer selectively formed in the major surface, the semiconductor layer extends up to an edge of the element isolation layer, and the contact hole is formed on a portion apart from immediately above the element isolation layer.

In the semiconductor device according to the third aspect of the present invention, at least the main part of the metal semiconductor compound layer is formed only in the region located immediately under the contact hole, whereby the metal semiconductor compound layer can be formed through a simple step of forming a metal film on the bottom portion of the contact hole and performing a heat treatment. Further, the contact hole is formed on the portion apart from immediately above the element isolation layer, whereby the epitaxial growth layer can be prevented from being formed as an abnormally growing layer due to influence by residual stress derived from the element isolation layer. Consequently, increase in a leakage current can be prevented.

According to a fourth aspect of the present invention, the semiconductor substrate comprises a semiconductor layer selectively formed in the major surface and containing an impurity, the semiconductor device further comprises an insulator layer formed on the major surface, the insulator layer defines a contact hole selectively opening on the semiconductor layer, the electrode is embedded in the contact hole and connected to the semiconductor layer, and the metal semiconductor compound layer is formed in a region of the major surface occupied by the semiconductor layer, including a region located immediately under the contact hole, and a main part thereof juts out from the region located immediately under the contact hole.

In the semiconductor device according to the fourth aspect of the present invention, the main part of the metal semiconductor compound layer is formed in the region occupied by the semiconductor layer while jutting out from the region located immediately under the contact hole, whereby the contact area on the interface between the metal semiconductor compound layer and the semiconductor layer is further enlarged. Therefore, the contact resistance between the electrode and the semiconductor substrate can be further reduced while keeping the diameter of the contact hole small.

According to a fifth aspect of the present invention, a method of manufacturing a semiconductor device comprises (a) a step of preparing a semiconductor substrate having a major surface, (b) a step of forming a metal film on a part of the major surface, (c) a step of forming a metal semiconductor compound layer on the part by performing a first heat treatment, (d) a step of epitaxially growing at least a part of the metal semiconductor compound layer into the semiconductor substrate in a direction inclined against the major surface by performing a second heat treatment, and (e) a step of connecting an electrode to the part of the major surface after the step (b).

In the method according to the fifth aspect of the present invention, the metal semiconductor compound layer is formed between the electrode and the semiconductor substrate and an epitaxial growth layer is so formed that at least a part thereof is inclined against the major surface of the semiconductor substrate, whereby the area of the interface between the epitaxial growth layer and the semiconductor substrate is enlarged and the interface resistivity is reduced. Consequently, a semiconductor device effectively reducing the contact resistance between the electrode and the semiconductor substrate is implemented.

According to a sixth aspect of the present invention, the step (a) includes (a-1) a step of preparing a semiconductor substrate mainly composed of silicon as the semiconductor substrate, and the step (d) includes (d-1) a step of performing heating at a temperature of at least 600° C. and not more than 850° C. for at least 30 minutes as the second heat treatment.

According to a seventh aspect of the present invention, the method of manufacturing a semiconductor device further comprises (e0) a step of performing heating at a temperature not lower than 800° C. for not more than 1 minute between the steps (c) and (d).

According to an eighth aspect of the present invention, the method of manufacturing a semiconductor device further comprises (f) a step of selectively forming a semiconductor layer in the major surface by selectively introducing an impurity into the major surface before the step (b), (g) a step of forming an insulator layer on the major surface before the step (f) and after the step (b), (h) a step of forming a contact hole selectively opening on the semiconductor layer in the insulator layer before the step (b), and (i) a step of selectively forming another semiconductor layer in the major surface to be identical in conductivity type to the semiconductor layer and deeper than the semiconductor layer by selectively introducing an impurity into the major surface through the contact hole before the step (b), the step (b) includes (b-1) a step of forming the metal film on a surface of the semiconductor layer exposed in the contact hole and on an inner wall surface of the contact hole, and the step (e) includes (e-1) a step of forming the electrode in the contact hole by charging the contact hole with a material for the electrode.

In the method according to the eighth aspect of the present invention, the metal semiconductor compound layer can be formed through a simple step of forming a metal film on the bottom portion of the contact hole and performing a heat treatment. Since another semiconductor layer is formed, further, sufficient distances can be ensured between the epitaxial growth layer and edge portions of the semiconductor layers even if the semiconductor layer is shallowly formed. Therefore, refinement of the semiconductor device can be attained while suppressing a leakage current.

According to a ninth aspect of the present invention, the method of manufacturing a semiconductor device further comprises (f) a step of selectively forming a semiconductor layer in the major surface by selectively introducing an impurity into the major surface before the step (b), (g) a step of forming an insulator layer on the major surface after the step (f) and before the step (b), (h) a step of forming a contact hole selectively opening on the semiconductor layer in the insulator layer before the step (b), and (i) a step of selectively forming an element isolation layer in the major surface before the step (f), the step (b) includes (b-1) a step of forming the metal film on a surface of the semiconductor layer exposed in the contact hole and on an inner wall surface of the contact hole, the step (e) includes (e-1) a step of forming the electrode in the contact hole by charging the contact hole with a material for the electrode, the step (f) includes (f-1) a step of forming the semiconductor layer by selectively introducing the impurity into the major surface while employing the element isolation layer as a screen, and the step (h) includes (h-1) a step of forming the contact hole on a portion apart from immediately above the element isolation layer.

In the method according to the ninth aspect of the present invention, the metal semiconductor compound layer can be formed through a simple step of forming a metal film on the bottom portion of the contact hole and performing a heat treatment. Further, the contact hole is formed on the portion apart from immediately above the element isolation layer, whereby the epitaxial growth layer can be prevented from being formed as an abnormally growing layer due to influence by residual stress derived from the element isolation layer. Consequently, a semiconductor device suppressing a leakage current is obtained.

According to a tenth aspect of the present invention, the method of manufacturing a semiconductor device further comprises (f) a step of forming a screen selectively defining an opening in a region of the major surface corresponding to the part on the major surface before the step (b), and (g) a step of selectively forming a semiconductor layer in the major surface by selectively introducing an impurity into the major surface through the opening before the step (b).

In the method according to the tenth aspect of the present invention, the metal semiconductor compound layer is formed on a surface of the semiconductor layer corresponding to the opening for selectively introducing the impurity contained by the semiconductor layer. Consequently, a semiconductor device having a wide contact area on the interface between the metal semiconductor compound layer and the semiconductor layer thereby further effectively reducing the contact resistance between the electrode and the semiconductor substrate is implemented.

According to an eleventh aspect of the present invention, the step (e) is carried out after the step (c), and the method further comprises (k) a step of removing an unreacted part of the metal film after the step (c) and before the step (e).

In the method according to the eleventh aspect of the present invention, the unreacted part of the metal film is removed after the metal semiconductor compound layer is formed and before the electrode is connected to the major surface of the semiconductor substrate. Consequently, the electrode can be readily formed while ensuring a sufficient thickness of the metal semiconductor layer even if the contact hole for forming the electrode is limited in diameter. In other words, refinement of the semiconductor device is further facilitated.

An object of the present invention is to provide a semiconductor device simultaneously implementing reduction of interface resistivity between a metal semiconductor compound layer and a semiconductor substrate and enlargement of a contact area thereby effectively reducing contact resistance between an electrode and the semiconductor substrate and a method of manufacturing the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 33 to 41 illustrate steps of manufacturing the semiconductor device according to the embodiment 4 of the present invention;

DESCRIPTION OF THE PREFERRED EMBODIMENTS

<1. Embodiment 1>

A semiconductor device 101 according to an embodiment 1 of the present invention is now described.

<1-1. Structure and Operation of Device>

Figure 1:
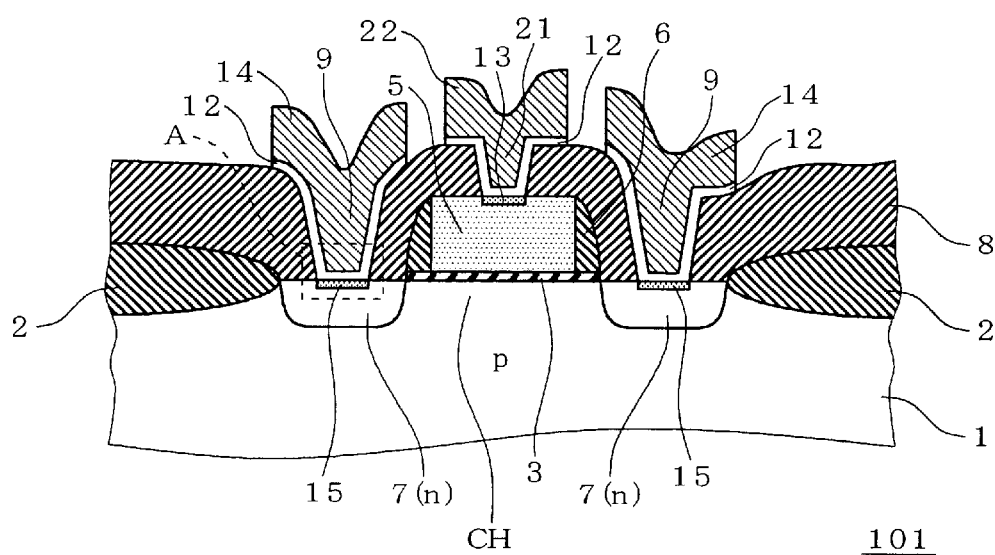
FIG. 1 is a front sectional view of a semiconductor device according to an embodiment 1 of the present invention.

FIG. 1 is a front sectional view of the semiconductor device 101 according to the embodiment 1. The semiconductor device 101 comprises a MOSFET on a major surface of a semiconductor substrate 1 mainly composed of silicon. A p-type semiconductor layer is exposed on the major surface of the semiconductor substrate 1. Further, element isolation layers 2 are selectively formed in the major surface of the semiconductor substrate 1. The element isolation layers 2, made of an insulator preferably prepared from a silicon oxide, electrically isolate a plurality of element regions in the semiconductor substrate 1 from each other.

The semiconductor substrate 1 comprises a pair of n-type semiconductor layers 7 selectively formed in an element region held between the two element isolation layers 2, to be exposed on the major surface. The pair of semiconductor layers 7 are isolated from each other. The surface layer part of the major surface of the semiconductor substrate 1 held between the pair of semiconductor layers 7 corresponds to a channel region CH of the MOSFET. The semiconductor layers 7 correspond to source/drain regions of the MOSFET.

An insulator film 3 is formed on the major surface of the semiconductor substrate 1. The insulator film 3 is preferably formed as a silicon oxide film or a film mainly composed of a silicon oxide. A gate electrode 5 is formed on the insulator film 3, to be opposed to the channel region CH. The gate electrode 5 is made of polysilicon doped with an impurity or polycide. The gate electrode 5 shown in FIG. 1 is made of polysilicon doped with an impurity. Side surfaces of the gate electrode 5 are covered with side walls 6 made of an insulator such as a silicon oxide.

An insulator layer 8 is formed to entirely cover the aforementioned structure formed over the semiconductor substrate 1. The insulator layer 8 is made of well-known PSG or BPSG, for example. In the insulator layer 8, a pair of contact holes 9 are selectively formed as through holes on positions located immediately above the pair of semiconductor layers 7, while a contact hole 21 is selectively formed similarly as a through hole on a position located immediately above the gate electrode 5.

Inner wall surfaces and bottom surfaces of the contact holes 9 and 21 are covered with a barrier layer 12. The barrier layer 12 is made of a conductive material such as a metal compound such as titanium nitride (TiN), for example, or a metal. The contact holes 9 are charged with main electrodes 14 made of a conductor through the barrier layer 12, whereby the pair of main electrodes 14 are connected to the pair of semiconductor layers 7. Similarly, the contact hole 21 is charged with a gate wire 22 made of a conductor through the barrier layer 12, whereby the gate wire 22 is connected to the gate electrode 5.

The gate wire 22 and the pair of main electrodes 14 are made of the same material, preferably tungsten or a metal mainly composed of tungsten having excellent coverage. Parts of the main electrodes 14 exposed beyond the surface of the insulator layer 8 function as main electrode wires.

Silicide layers 15 are formed between the main electrodes 14 and the semiconductor layers 7, more correctly on the boundary portions between the barrier layer 12 and the semiconductor layers 7. Further, a silicide layer 13 is formed between the gate wire 22 and the gate electrode 5, more specifically, on the boundary portion between the barrier layer 12 and the gate electrode 5, similarly to the silicide layers 15. The silicide layers 13 and 15 are made of titanium silicide or cobalt silicide, for example. Cobalt silicide is particularly preferable as the material for the silicide layers 15 for a reason described later.

Figure 2:
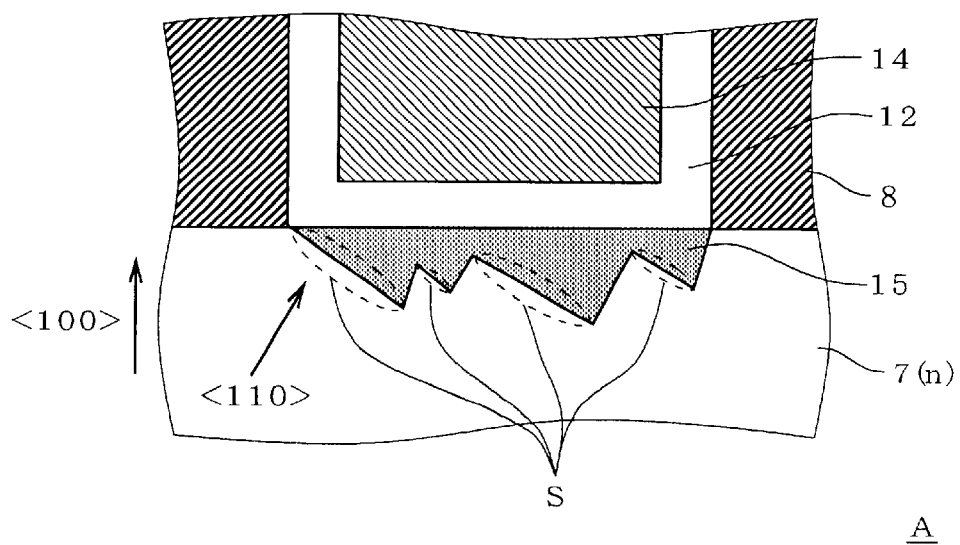
FIG. 2 is a partially enlarged view of FIG. 1.

FIG. 2 is an enlarged view of a part A in FIG. 1. As shown in FIG. 2, an epitaxial growth layer is formed on the silicide layer 15. A heat treatment is performed under specific conditions described later, thereby forming irregularities on the interface between the epitaxial growth layer and the semiconductor layer 7. These irregularities result from selective epitaxy in a plurality of directions perpendicular to low index crystal planes, such as (100), (110) and (111) planes having indices of not more than 4, of the semiconductor substrate 1. Referring to FIG. 2, the major surface of the semiconductor substrate 1 is oriented in the <100>direction and parts of the silicide layer 15 selectively epitaxially grow in the <110>direction of the semiconductor substrate 1, whereby the interface between the silicide layer 15 and the semiconductor layer 7 includes surfaces S parallel to the (110) plane of the semiconductor substrate 1.

In the semiconductor device 101, the silicide layer 15 interposed between the main electrode 14 and the semiconductor layer 7 has the epitaxial growth layer as hereinabove described, whereby the interface resistivity ρ between the silicide layer 15 and the semiconductor layer 7 is suppressed. Further, the interface between the epitaxial growth layer and the semiconductor layer 7 has the irregularities, thereby advantageously increasing the area of the interface, i.e., the contact area SA between the silicide layer 15 and the semiconductor layer 7.

The contact resistance between the main electrode 14 and the semiconductor layer 7 is effectively reduced due to the reduction of the interface resistivity ρ and the increase of the contact area SA. Further, this effect can be attained without enlarging the diameter of the contact hole 9, for satisfying the requirement for refinement of the semiconductor device 101.

<1-2. Fabrication Method for Device>

Figure 3:
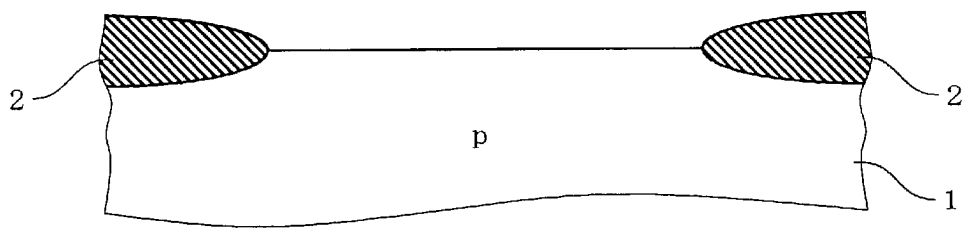
FIGS. 3 to 13 illustrate steps of manufacturing the semiconductor device according to the embodiment 1 of the present invention.
Figure 4:
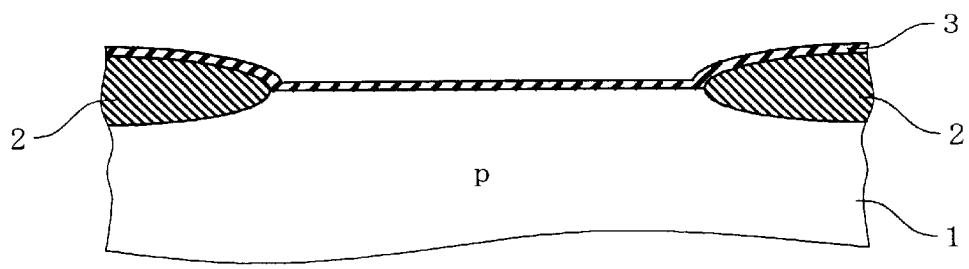

FIGS. 3 to 13 illustrate steps of a method of manufacturing the semiconductor device 101. In order to manufacture the semiconductor device 101, the step shown in FIG. 3 is first carried out. In the step shown in FIG. 3, the semiconductor substrate 1 mainly composed of silicon is first prepared. The p-type semiconductor layer is exposed on the major surface of the semiconductor substrate 1. For example, the overall semiconductor substrate 1 is made of a p-type semiconductor, or the p-type semiconductor layer is formed in the major surface of the semiconductor substrate 1 as a p well, for example. Thereafter the pair of element isolation layers 2 are selectively formed in the major surface of the semiconductor substrate 1. The element isolation layers 2 are formed as silicon oxide layers through thermal oxidation, for example.

Figure 5:
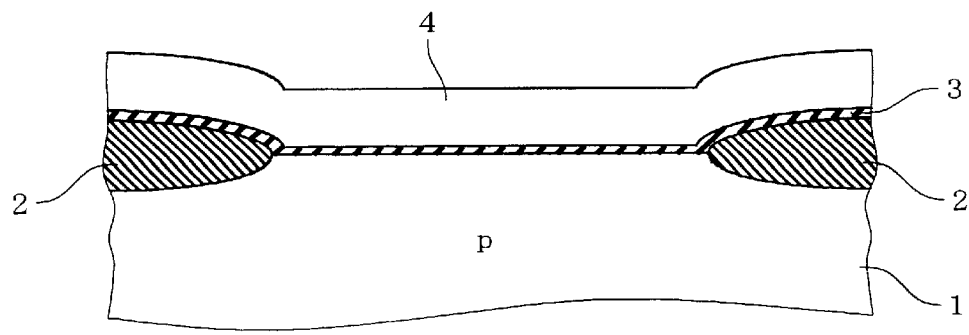
Figure 6:
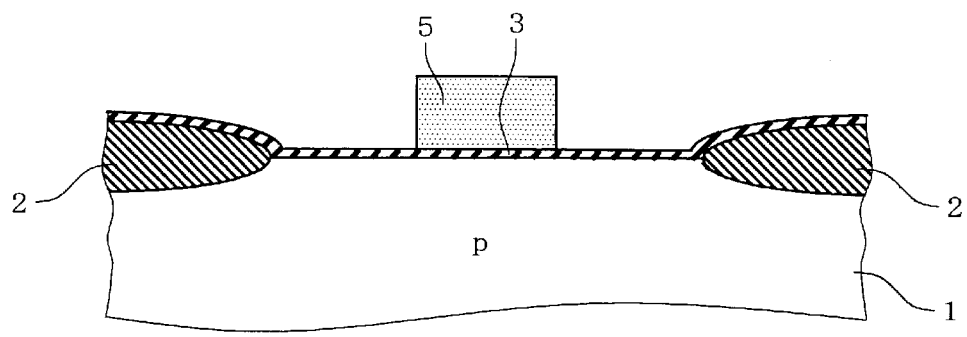

Then, the insulator film 3 is formed on the major surface of the semiconductor substrate 1 exposing the p-type semiconductor layer and the element isolation layers 2. The insulator film 3 is formed by thermal oxidation, for example. Thereafter a material 4 for the gate electrode 5 is deposited on the insulator film 3, as shown in FIG. 5. Then, the deposited material 4 is patterned for forming the gate electrode 5, as shown in FIG. 6. In this stage, it is possible to form the so-called LDD (lightly doped drain) structure by selectively implanting a p-type impurity into the major surface of the semiconductor substrate 1 held between the pair of element isolation layers 2 in a concentration lower than that in the step shown in FIG. 8 described later using the gate electrode 5 and the element isolation layers 2 as screens and thereafter diffusing the impurity.

Figure 7:
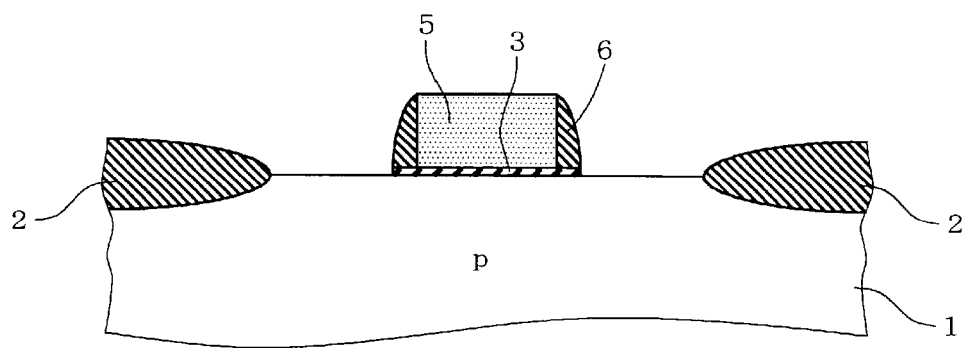

Then, the side walls 6 are formed on the side surfaces of the gate electrode 5, as shown in FIG. 7. The side walls 6 are formed by depositing a material therefor such as a silicon oxide, for example, to cover the overall surface exposed over the semiconductor substrate 1 and thereafter performing anisotropic etching such as RIE.

Figure 8:
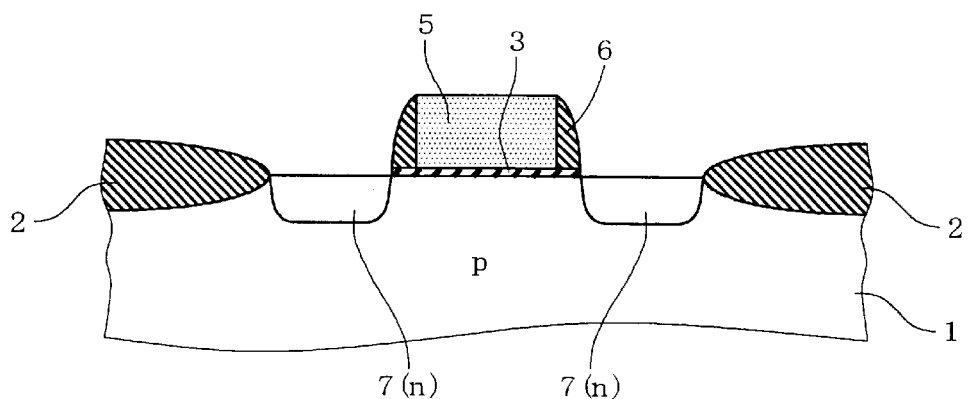

Then, the pair of semiconductor layers 7 are selectively formed in the major surface of the semiconductor substrate 1, as shown in FIG. 8. The pair of semiconductor layers 7 are formed by selectively implanting an n-type impurity into the region of the major surface of the semiconductor substrate 1 held between the pair of element isolation layers 2 using the gate electrode 5, the side walls 6 and the pair of element isolation layers 2 as screens and thereafter diffusing the impurity while simultaneously activating the same through a heat treatment. Consequently, the pair of semiconductor layers 7 are so formed as to be exposed on the region of the major surface of the semiconductor substrate 1 held between the pair of element isolation layers 2 and opposed to each other with a portion located immediately under the gate electrode 5 therebetween.

Figure 9:
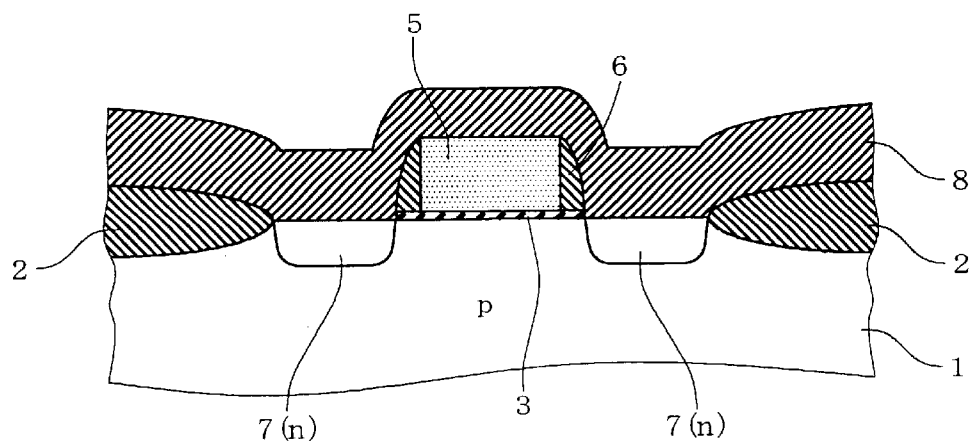
Figure 10:
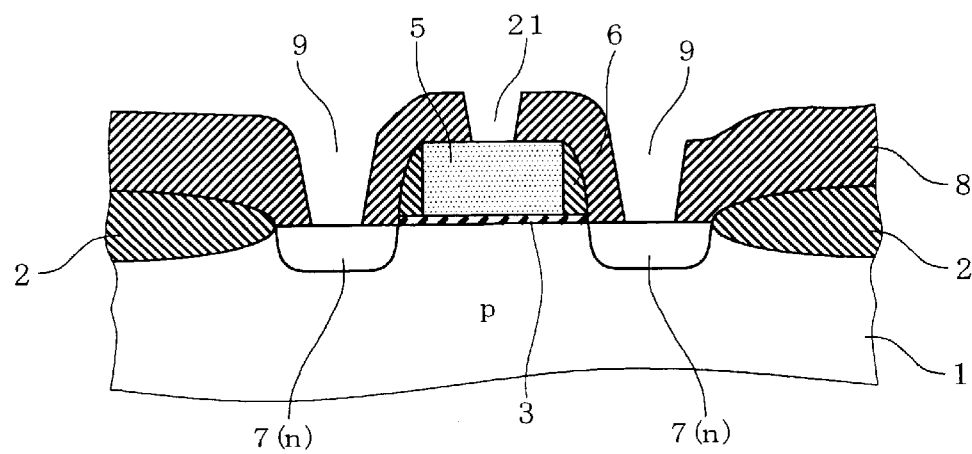

Then, the insulator layer 8 is formed to cover the overall surface exposed over the semiconductor substrate 1, as shown in FIG. 9. The insulator layer 8 is formed by depositing a material such as PSG. Then, the contact holes 9 are selectively formed as through holes on portions of the insulator layer 8 located immediately above the semiconductor layers 7 while the contact hole 21 is simultaneously selectively formed on a portion located immediately above the gate electrode 5, as shown in FIG. 10.

Figure 11:
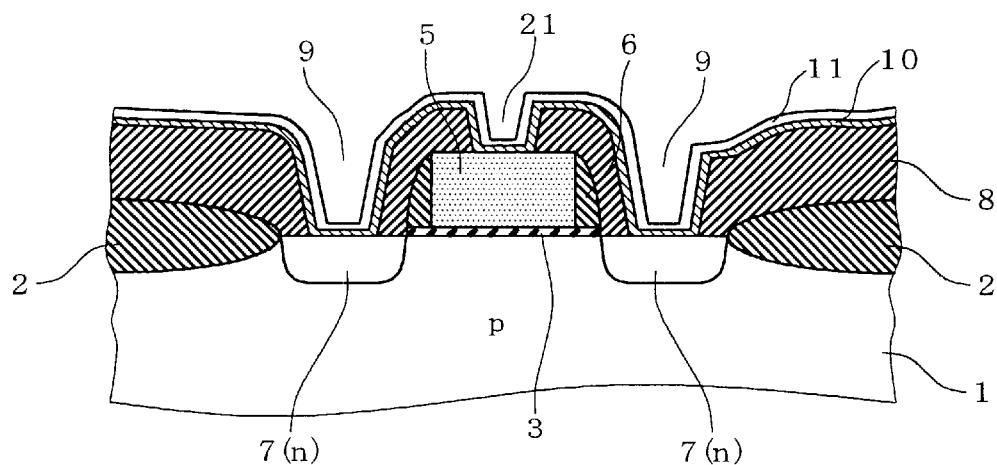

Then, the step shown in FIG. 11 is carried out. In the step shown in FIG. 11, a metal film 10 is formed to cover the overall surfaces exposed over the major surface of the semiconductor substrate 1, i.e., the surfaces of the semiconductor layers 7 exposed in the contact holes 9, the surface of the gate electrode 5 exposed in the contact hole 21 and the overall surface of the insulator layer 8 including the inner walls of the contact holes 9 and 21.

The metal film 10 is prepared from titanium (Ti) or cobalt (Co), for example. The metal film 10 is formed by sputtering, for example. Thereafter a barrier film 11 is formed on the metal film 10. The barrier film 11 is prepared from a metal compound such as titanium nitride (TiN) or a metal.

Figure 12:
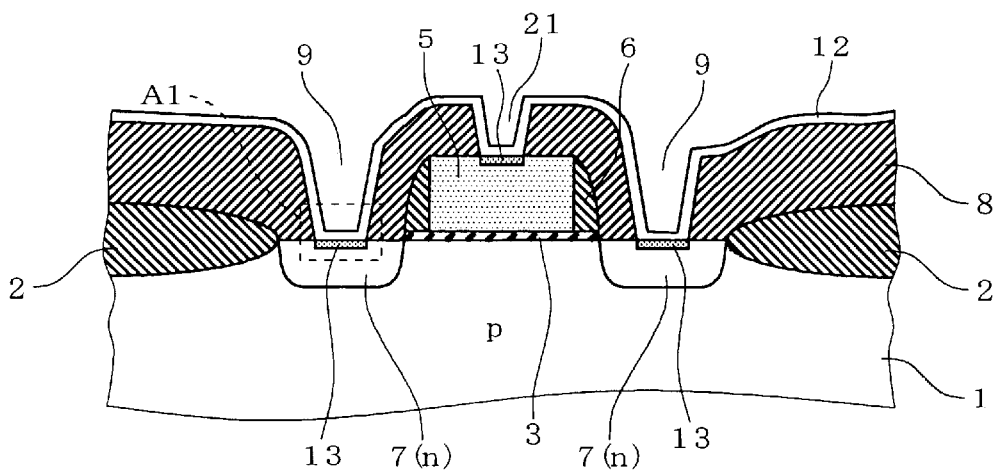

Then, the step shown in FIG. 12 is carried out. In the step shown in FIG. 12, a heat treatment (hereinafter referred to as a first heat treatment) is performed in the temperature range of 400° C. to 800° C. Consequently, the barrier film 11 and the metal film 10 are integrated with each other to define the barrier layer 12. When the barrier film 11 is made of titanium nitride and the metal film 10 is made of titanium, for example, the barrier film 11 is not changed but the metal film 10 is chemically converted into titanium nitride by this heat treatment so that the barrier film 11 and the metal film 10 can be collectively grasped as the barrier layer 12 made of titanium nitride.

Figure 13:
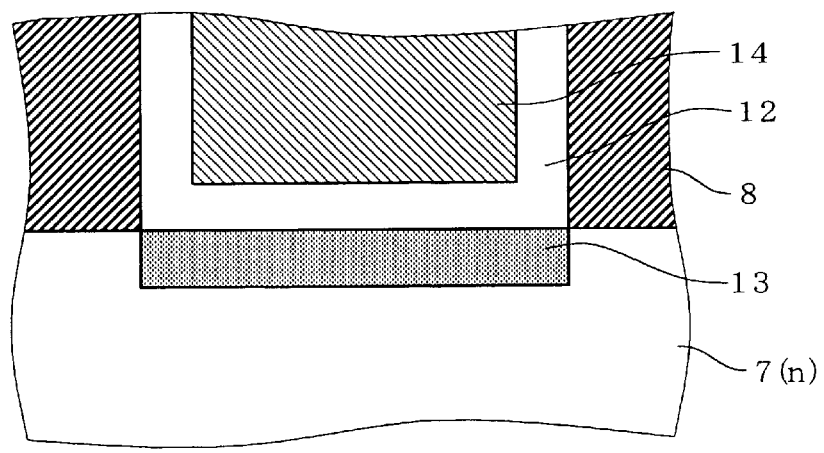

The metal film 10 further reacts with the semiconductor layers 7 by the first heat treatment, for forming the silicide layers 13 on the interfaces between the barrier layer 12 and the semiconductor layers 7 and that between the barrier layer 12 and the gate electrode 5. The silicide layers 13 formed on the interfaces between the barrier layer 12 and the semiconductor layers 7 may be mismatched in crystal structure with the semiconductor substrate 1 (or the semiconductor layers 7). Further, the interface between each silicide layer 13 and each semiconductor layer 7 is flat, as understood from FIG. 13 showing a part Al of FIG. 12 in an enlarged manner.

Then, CVD is performed for charging the contact holes 9 and 21 with a conductive material thereby forming the main electrodes 14 and the gate wire 2 (FIG. 1). Thereafter a heat treatment (hereinafter referred to as a second heat treatment) is applied in the temperature range of at least 600° C. and not more than 850° C. for a heating time of at least 30 minutes. Consequently, each silicide layer 13 formed on the interface between the barrier layer 12 and each semiconductor layer 7 epitaxially grows toward the semiconductor layer 7, as shown in FIG. 2.

Under the conditions for the second heat treatment, epitaxy selectively progresses in directions perpendicular to low index planes. When the metal film 10 is made of cobalt and hence the silicide layer 13 is formed as cobalt silicide ($CoSi_2$), for example, epitaxy of (110) and (111) planes of $CoSi_2$ progresses with respect to the (110) and (111) planes of the semiconductor substrate 1 with excellent selectivity in particular.

Consequently, the silicide layer 15 having irregularities is formed on the interface between the barrier layer 12 and the semiconductor layer 7, as illustrated in FIG. 2. While the major surface of the semiconductor substrate 1 is along the (100) plane in FIG. 2, the selective epitaxy is not along a single direction and hence the orientation of the major surface of the semiconductor substrate 1 is not restricted in formation of the irregularities on the interface of the silicide layer 15. The semiconductor device 101 is completed through the aforementioned steps.

The conditions for the second heat treatment have been confirmed through experiments, and the following specificity is recognized in both the heating temperature and the heating time as compared with conditions out of the specific ranges. If the second heat treatment is applied at a temperature exceeding 850° C. for over 30 minutes, the silicide layer 13 is condensed. In other words, no epitaxial growth layer is formed. Consequently, the interface resistivity ρ between the silicide layer 13 and the semiconductor layer 7 is increased.

When the second heat treatment is applied at a heating temperature of less than 600° C. or for a heating time less than 30 minutes, no epitaxy is caused or no selective growth is caused toward directions inclined against the major surface. Therefore, no silicide layer 15 having irregularities is formed on the interface between the semiconductor layer 7 and the barrier layer 12.

Thus, no epitaxial layer having irregularities is formed on the interface by the heat treatment at the heating temperature of 800° C. for the heating time of 30 seconds disclosed in Japanese Patent Laying-Open Gazette No. 8-191053 or that at the heating temperature of 500° C. (no heating time described) disclosed in Japanese Patent Laying-Open Gazette No. 9-115860. Under the aforementioned conditions for the second heat treatment, on the other hand, the silicide layer 15 including the epitaxial layer having irregularities is formed on the interface.

In order to effectively form the epitaxial layer having irregularities on the interface, the silicide layer 13 is preferably matched in crystal structure with the semiconductor substrate 1, i.e., the former is preferably approximate in crystal lattice constant to the latter. Cobalt silicide is a fine example of such silicide. In other words, the metal film 10 is particularly preferably prepared from cobalt or a material mainly composed of cobalt.

The second heat treatment, which is performed after forming the main electrodes 14 and the gate wire 22 in the aforementioned method, may be performed in any stage after formation of the silicide layers 13 by the first heat treatment, in general. For example, the second heat treatment may be performed immediately after the step shown in FIG. 12 for forming the silicide layers 13 or after a step (not shown) of forming an insulator layer for defining thereon a wiring layer located above the main electrodes 14 and the gate wire 22 on the insulator layer 8. In the latter case, the second heat treatment can be performed for also thermally shrinking the insulator layer formed on the insulator layer 8, or a heat treatment applied for forming the insulator layer on the insulator layer 8 itself can be performed as the second heat treatment.

It is further preferable to perform a heat treatment (hereinafter referred to as a third heat treatment) at a heating temperature of at least 800° C. for a heating time of not more than 1 minute between the first and second heat treatments. The silicide layers 13 are stabilized by the third heat treatment, whereby the silicide layers 15 thereafter formed can be further reduced in resistance.

<2. Embodiment 2>

Figure 14:
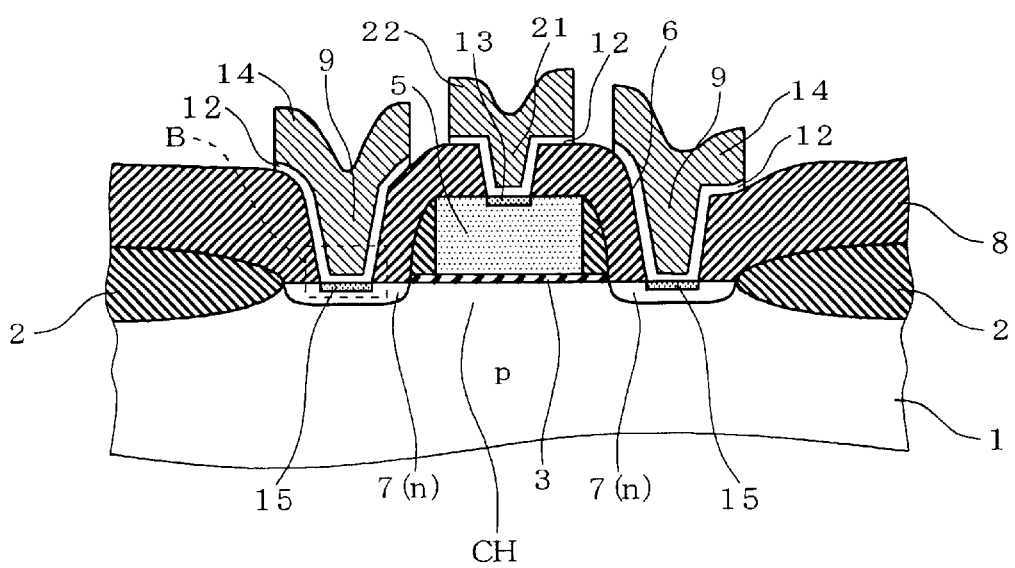
FIG. 14 is a front sectional view of a semiconductor device forming the background of an embodiment 2 of the present invention.
Figure 15:
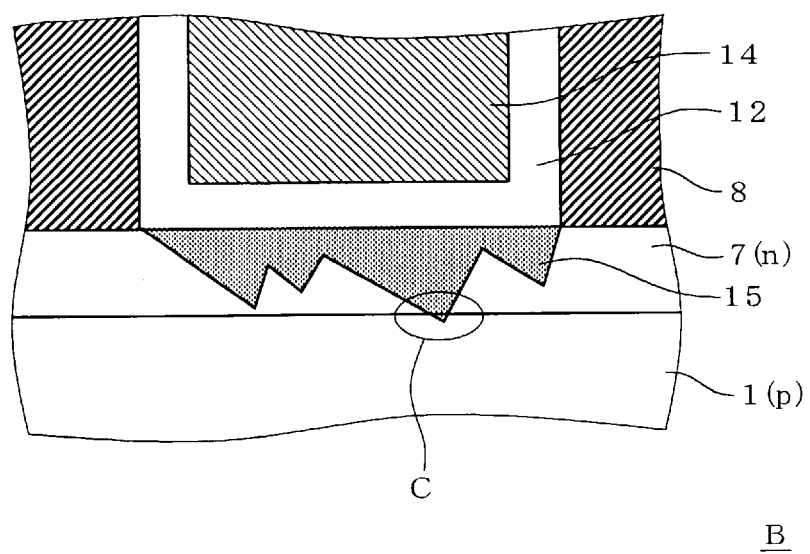
FIG. 15 is a partially enlarged view of FIG. 14.

FIG. 14 is a front sectional view of a semiconductor device for showing the background of an embodiment 2 of the present invention. In this semiconductor device corresponding to a specific example of the semiconductor device 101, semiconductor layers 7 are shallowly formed equivalently to silicide layers 15. Following recent refinement of the semiconductor device, the semiconductor layers 7 tend to be further shallowed as shown in FIG. 15. When each semiconductor layer 7 is thus shallowly formed equivalently to each silicide layer 15, a forward end portion C (projecting toward a deep part of a p-type semiconductor substrate 1) of an epitaxial layer included in the silicide layer 15 may pass through the bottom portion of the semiconductor layer 7 to reach the semiconductor substrate 1, as understood from FIG. 15 showing a part B of FIG. 14 in an enlarged manner.

In this configuration, a p-n junction between the semiconductor layer 7 and the semiconductor substrate 1 is broken to generate a junction leakage current. Even if the forward end portion C does not reach the p-n junction on the bottom portion of the semiconductor layer 7, the junction leakage current increases if the distance between the forward end portion C and the bottom portion of the semiconductor layer 7 is short. A semiconductor device 102 according to the embodiment 2 of the present invention is so formed as to effectively suppress increase in such a junction leakage current.

Figure 16:
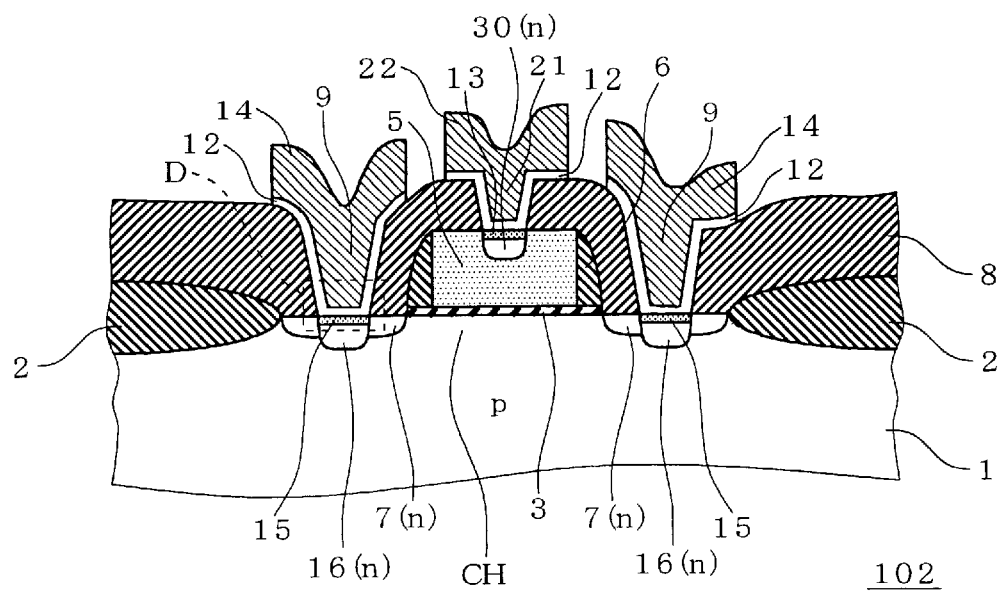
FIG. 16 is a front sectional view of a semiconductor device according to the embodiment 2 of the present invention.

FIG. 16 is a front sectional view showing the structure of the semiconductor device 102 according to the embodiment 2. The semiconductor device 102 is characteristically different from the semiconductor device 101 in the same further comprising a pair of semiconductor layers 16. The pair of semiconductor layers 16, which are of n conductivity types similarly to semiconductor layers 7, are selectively formed more deeply than the semiconductor layers 7 to cover portions of a major surface of a semiconductor substrate 1 corresponding to those located immediately under contact holes 9. The semiconductor layers 7 and the semiconductor layers 16 are coupled with each other to integrally function as source/drain regions of a MOSFET.

Figure 17:
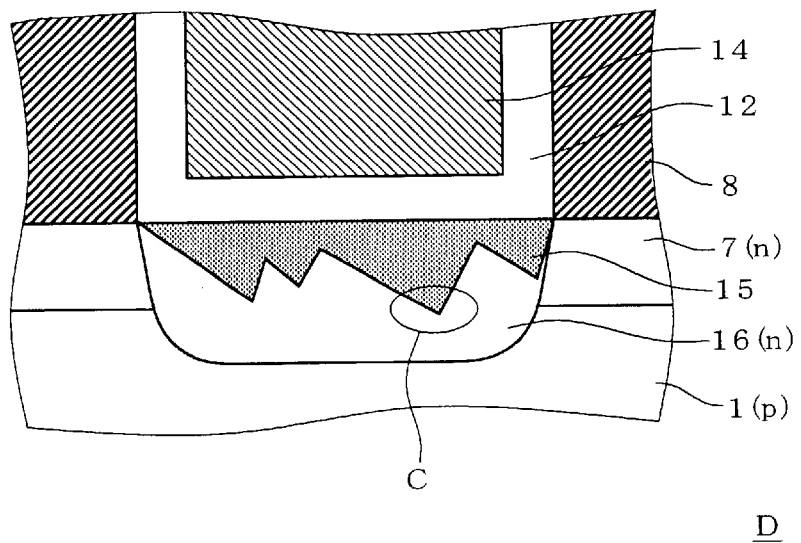
FIG. 17 is a partially enlarged view of FIG. 16.

As understood from FIG. 17 showing a part D of FIG. 16 in an enlarged manner, a sufficient distance is guaranteed between a forward end portion C and a p-n junction due to each semiconductor layer 16 provided in the semiconductor substrate 1, even if each semiconductor layer 7 is formed to be equivalent to or shallower than each silicide layer 15. Therefore, the semiconductor layer 7 can be shallowed for refining the semiconductor device 102 without increasing a junction leakage current.

Figure 18:
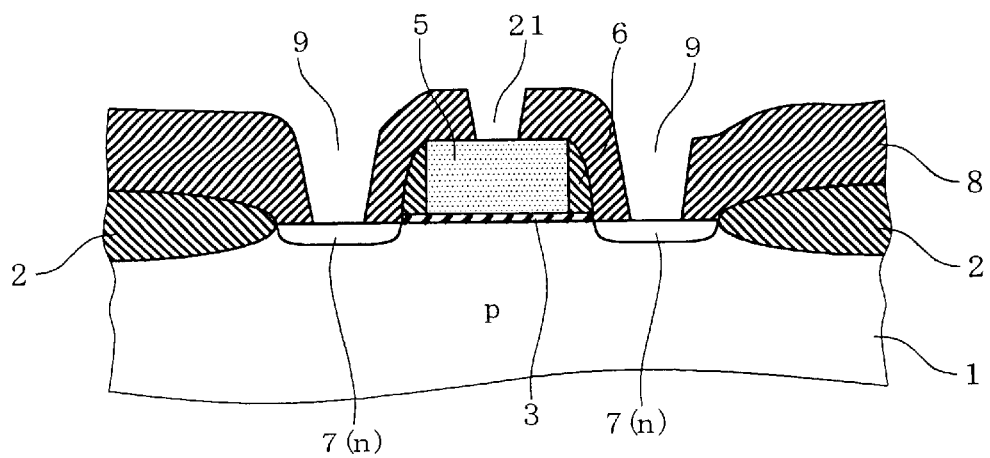
FIGS. 18 to 22 illustrate steps of manufacturing the semiconductor device according to the embodiment 2 of the present invention.

FIGS. 18 to 22 illustrate steps of a method of manufacturing the semiconductor device 102. In order to manufacture the semiconductor device 102, steps similar to those shown in FIGS. 3 to 10 are first carried out. In the step similar to that shown in FIG. 8, the semiconductor layers 7 are shallowly formed. Consequently, an intermediate structure shown in FIG. 18 is obtained through the step similar to that shown in FIG. 10.

Figure 19:
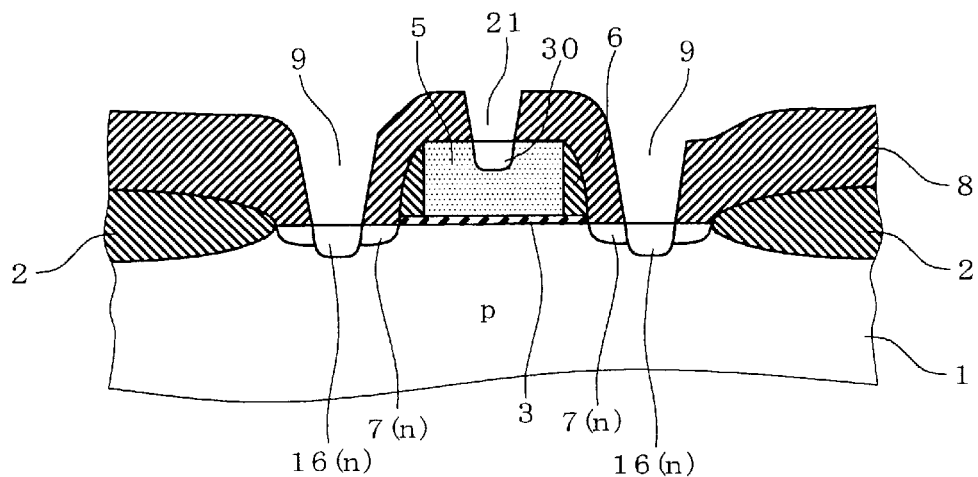

Then, the pair of semiconductor layers 16 are selectively formed in the major surface of the semiconductor substrate 1, as shown in FIG. 19. The pair of semiconductor layers 16 are formed by selectively implanting an n-type impurity into the major surface of the semiconductor substrate 1 and an upper surface of a gate electrode 5 through contact holes 9 and 21 by using the insulator layer 8 as a screen and thereafter diffusing and simultaneously activating the impurity through a heat treatment.

Consequently, the pair of semiconductor layers 16 are formed to be of n conductivity types similarly to the semiconductor layers 7, to be coupled with the pair of semiconductor layers 7 and to cover portions of the major surface of the semiconductor substrate 1 corresponding to those located immediately under the contact holes 9. The n-type impurity is so implanted and diffused that the semiconductor layers 16 are deeper than the semiconductor layers 7.

Figure 20:
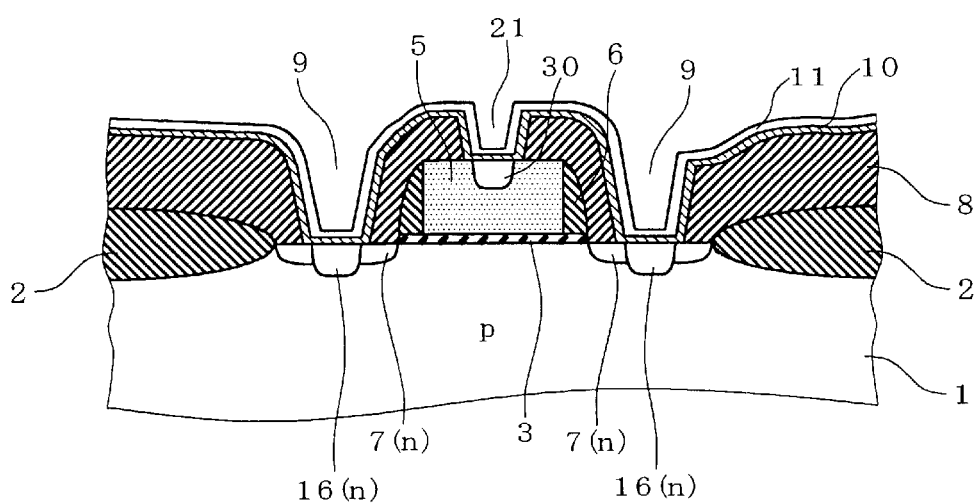
Figure 21:
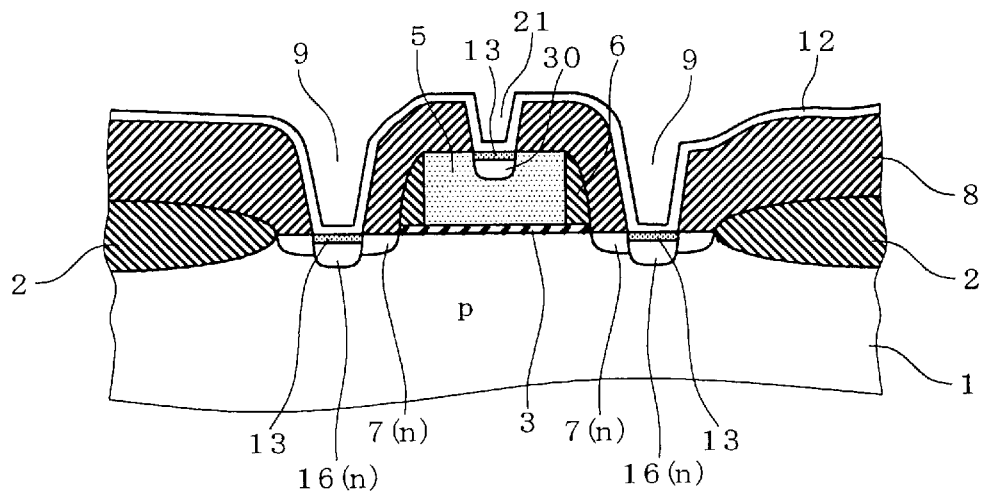
Figure 22:
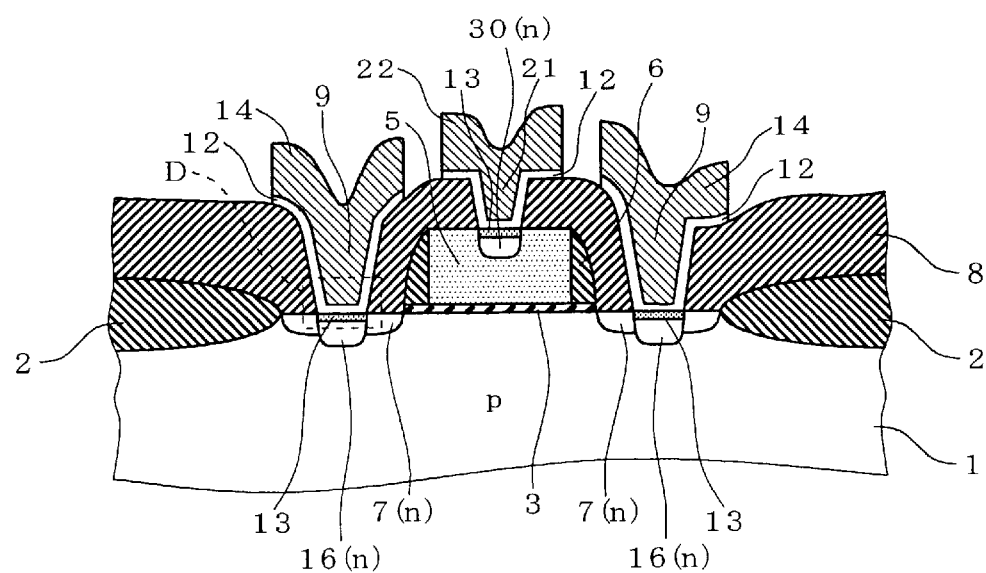

Then, a metal film 10 and a barrier film 11 are formed to cover the overall surfaces exposed over the major surface of the semiconductor substrate I as shown in FIG. 20, similarly to the step shown in FIG. 11. Then, a first heat treatment is first performed in the temperature range of 400° C. to 800° C. as shown in FIG. 21, similarly to the step shown in FIG. 12. Consequently, a barrier layer 12 and silicide layers 13 are formed. Thereafter CVD is performed to charge the contact holes 9 and 21 with a conductive material thereby forming main electrodes 14 and a gate wire 23, as shown in FIG. 22.

Referring again to FIG. 16, a second heat treatment is then performed in the temperature range of 600° C. to 850° C. for a heating time of at least 30 minutes. Consequently, each silicide layer 13 formed on the interface between the barrier layer 12 and each semiconductor layer 16 epitaxially grows to form each silicide layer 15, as shown in FIG. 17. The semiconductor device 102 is completed through the aforementioned steps.

Figure 23:
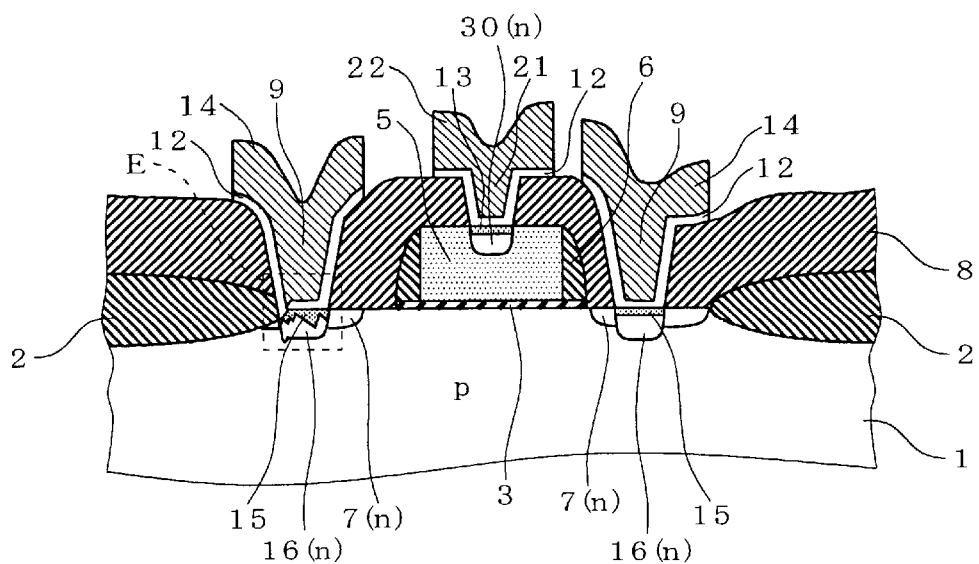
FIG. 23 is a front sectional view of a semiconductor device compared/contrasted with a more preferred example of the embodiment 2 of the present invention.

FIG. 23 is a front sectional view showing the structure of a semiconductor device compared with the semiconductor device 101 or 102 according to the embodiment 1 or 2, for illustrating a more preferable mode. The semiconductor device shown in FIG. 23 corresponds to such an example that the contact holes 9 and 21 deviate leftward from designed positions in the steps of forming the contact holes 9 and 21 of the semiconductor device 102 due to misalignment of mask patterns.

Figure 24:
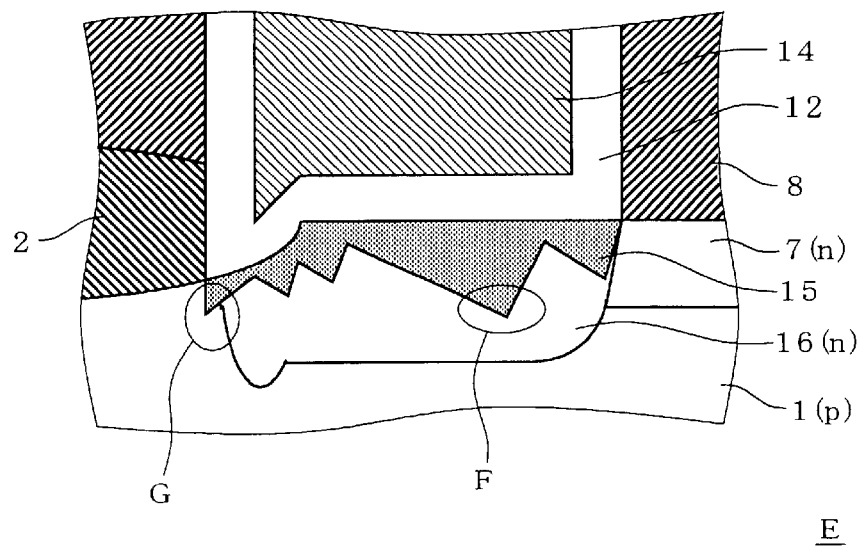
FIG. 24 is a partially enlarged view of FIG. 23.
Figure 25:
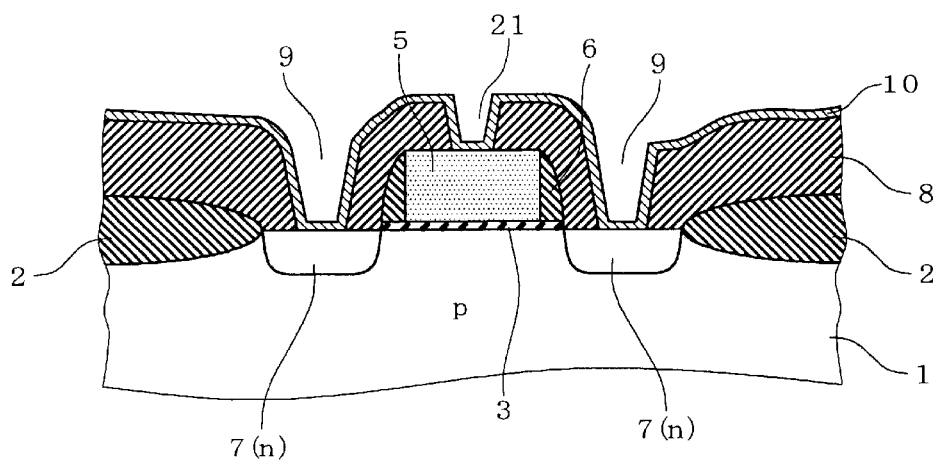
FIGS. 25 to 30 illustrate steps of manufacturing a semiconductor device according to an embodiment 3 of the present invention.

If this deviation is remarkable, the contact holes 9 overlap with the element isolation layers 2, as shown in FIG. 23. As understood from FIG. 24 showing a part E of FIG. 23 in an enlarged manner, a forward end portion F of the silicide layer 15 sufficiently separating from the element isolation layer 2 remains in the semiconductor layer 16 with a sufficient distance from the p-n junction. However, another forward end portion G close to the element isolation layer 2 may not be capable of keeping a sufficient distance from the p-n junction, or may reach the p-n junction.

In this case, a junction leakage current increases. This is derived from abnormal growth of the silicide layer 13 on an end portion of the contact hole 9 during the second heat treatment due to residual stress present in a region of the semiconductor substrate 1 close to the element isolation layer 2.

This problem is not unavoidable in the process of manufacturing the semiconductor device 101 or 102 but preventable by properly setting the conditions for forming the element isolation layer 2 or the silicide layer 13. In order to improve the reliability of the semiconductor device 101 or 102, however, it is more desirable to locate a mask pattern so that the contact hole 9 does not overlap with the element isolation layer 2, i.e., the contact hole 9 is positioned on a portion apart from immediately above the element isolation layer 2.

<3. Embodiment 3>

A semiconductor device according to an embodiment 3 of the present invention is now described. This semiconductor device is characterized in a method of manufacturing the same, and similar in structure to that shown in FIG. 1. FIGS. 25 to 30 illustrate steps of the method of manufacturing the semiconductor device according to the embodiment 3. In order to manufacture the semiconductor device, steps similar to those shown in FIGS. 3 to 10 are first carried out for thereafter carrying out the step shown in FIG. 25. In the step shown in FIG. 25, a metal film 10 is formed to cover overall surfaces exposed over a major surface of a semiconductor substrate 1, similarly to the step shown in FIG. 11. However, no barrier film 11 is formed.

Figure 26:
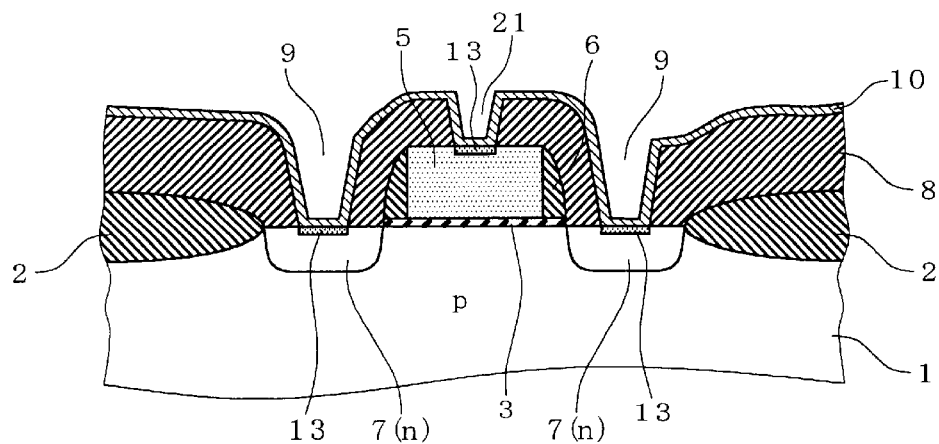
Figure 27:
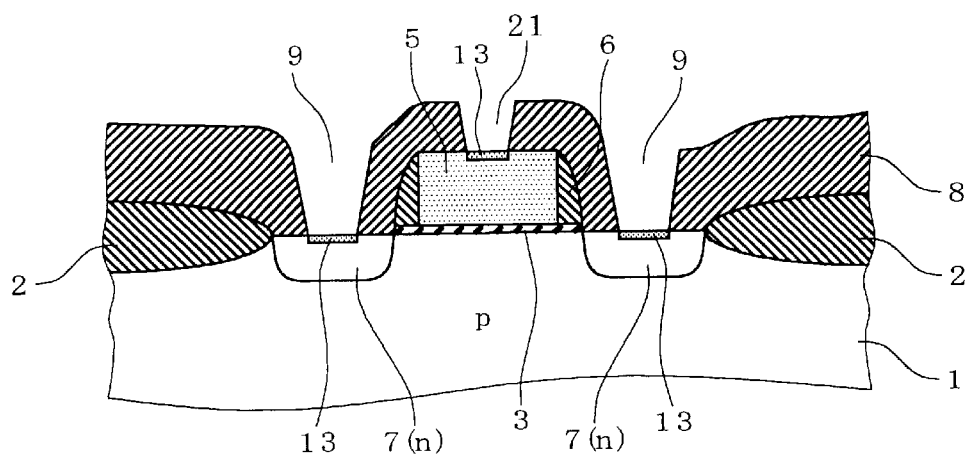
Figure 28:
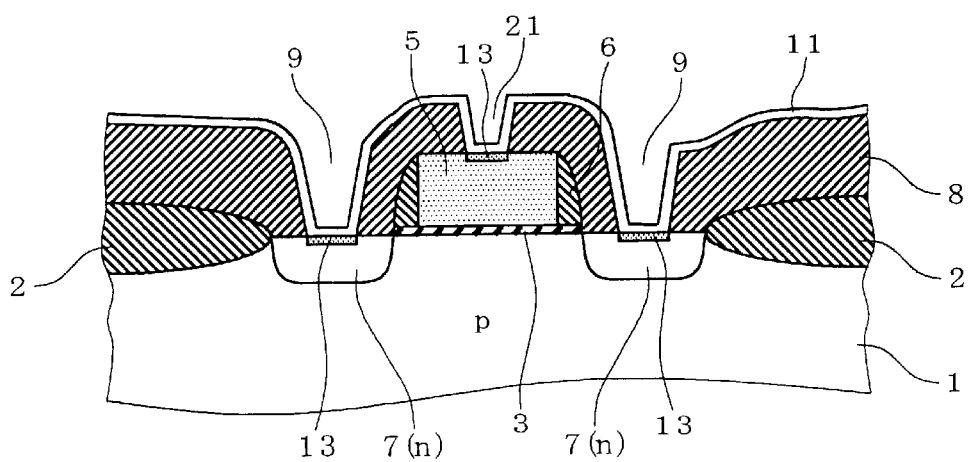

Then, a first heat treatment is performed in the temperature range of 400° C. to 800° C. as shown in FIG. 26, similarly to the step shown in FIG. 12. Consequently, silicide layers 13 are formed on the interfaces between the metal film 10 and semiconductor layers 7 and between the metal film 10 and a gate electrode 5. Thereafter an unreacted part of the metal film 10 is removed, as shown in FIG. 27. Then, a barrier film 11 is formed to cover the overall surfaces exposed over the major surface of the semiconductor substrate 1, as shown in FIG. 28.

Figure 29:
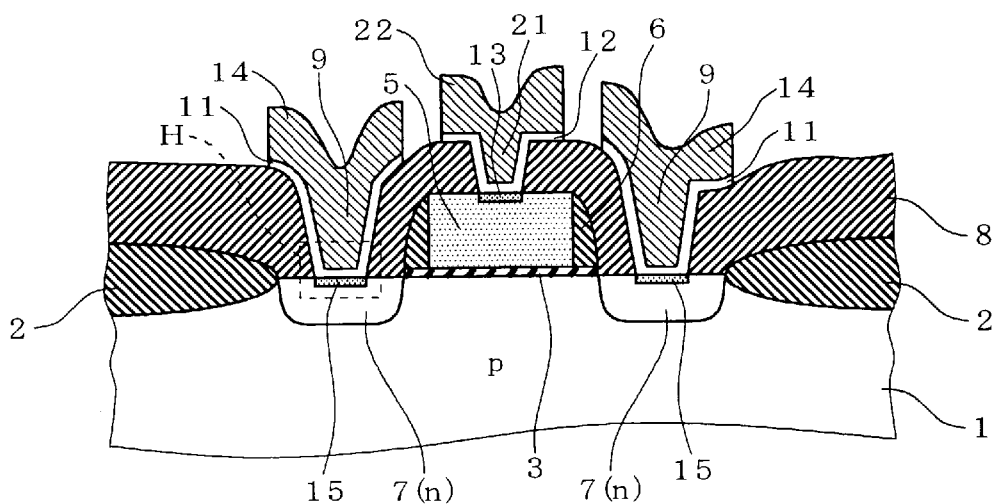

Then, the step shown in FIG. 29 is carried out. In the step shown in FIG. 29, CVD is first performed for charging contact holes 9 and 21 with a conductive material, thereby forming main electrodes 14 and a gate wire 22. Then, a second heat treatment is performed in the temperature range of 600° C. to 850° C. for a heating time of at least 30 minutes.

Figure 30:
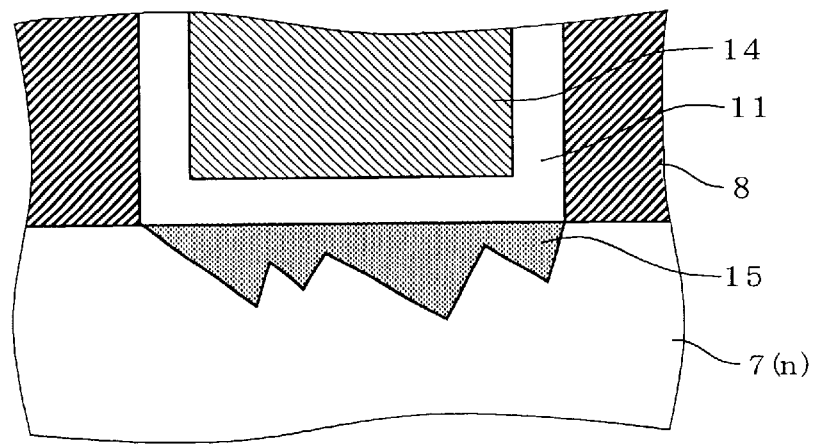

As a result of this treatment, the silicide layer 13 formed on the interface between the barrier film 11 and each semiconductor layer 7 epitaxially grows to form a silicide layer 15, as understood from FIG. 30 showing a part H of FIG. 29 in an enlarged manner. Similarly to the embodiment 1, the second heat treatment may be performed in any step after formation of the silicide layer 13 through the first heat treatment. The semiconductor device according to the embodiment 3 is completed through the aforementioned steps.

In order to reduce the contact resistance between the main electrode 14 and the semiconductor layer 7, the silicide layer 15 must be formed in a sufficient thickness on the bottom portion of the contact hole 9. To this end, the metal film 10 must be formed in a sufficient thickness. If the metal film 10 is increased in thickness and not removed but left, however, the effective diameter of the contact hole 9 to be charged with the main electrode 14 is reduced.

Consequently, the main electrode 14 may be hard to embed and deteriorated in coverage. In the method of manufacturing the semiconductor device according to the embodiment 3, the metal film 10 is so formed that the part remaining with no reaction is removed after formation of the silicide layer 13, whereby the silicide layer 15 can be formed in a sufficient thickness while the main electrode 14 can be improved in coverage. The step of removing the unreacted part of the metal film 10 may be carried out in any stage after formation of the silicide layer 13 and before formation of the barrier film 11.

<4. Embodiment 4>

According to each of the embodiments 1 to 3, each silicide layer 15 is substantially formed only on the region located immediately under each contact hole 9, although the same may slightly jut out from the region located immediately under the contact hole 9. In other words, at least a main part of the silicide layer 15 is formed only immediately under the contact hole 9. However, the present invention is not restricted to such an aspect. Another exemplary aspect of the present invention is now described.

Figure 31:
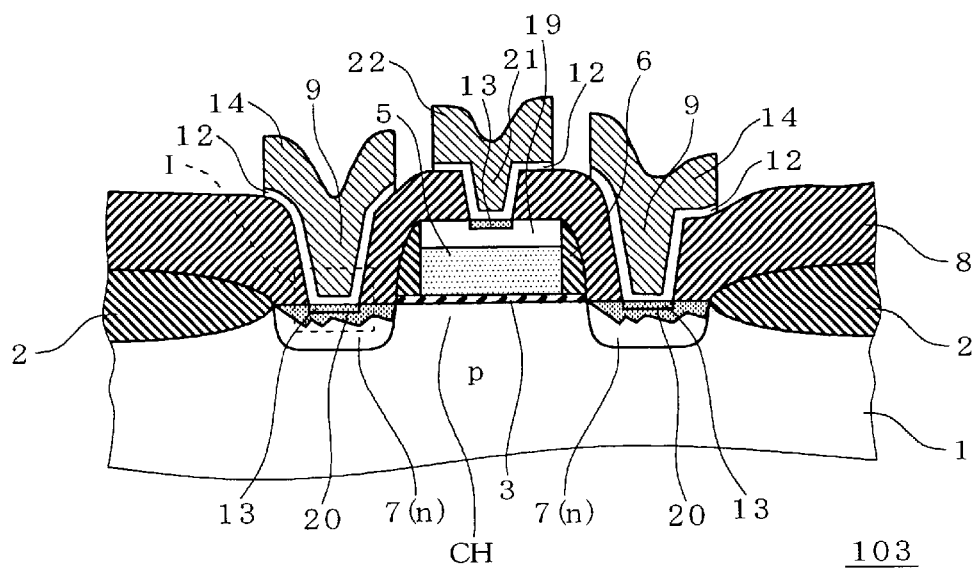
FIG. 31 is a front sectional view of a semiconductor device according to an embodiment 4 of the present invention.

FIG. 31 is a front sectional view showing the structure of a semiconductor device 103 according to an embodiment 4 of the present invention. The semiconductor device 103 is characteristically different from the semiconductor device 101 in that silicide layers 13 and silicide layers 20 are interposed between main electrodes 14 and semiconductor layers 7 in place of the silicide layers 15. The silicide layers 20 are selectively formed on regions of a major surface of a semiconductor substrate 1 included in the semiconductor layers 7, while the silicide layers 13 are formed on the interfaces between a barrier layer 12 and the silicide layers 20.

While the silicide layers 13 are substantially formed only immediately under contact holes 9, the silicide layers 20 are substantially formed to jut out from immediately under the contact holes 9. In other words, main parts of the silicide layers 20 jut out from immediately under the contact holes 9 to widely cover inner regions of exposed surfaces of the semiconductor layers 7, dissimilarly to the silicide layers 13.

Figure 32:
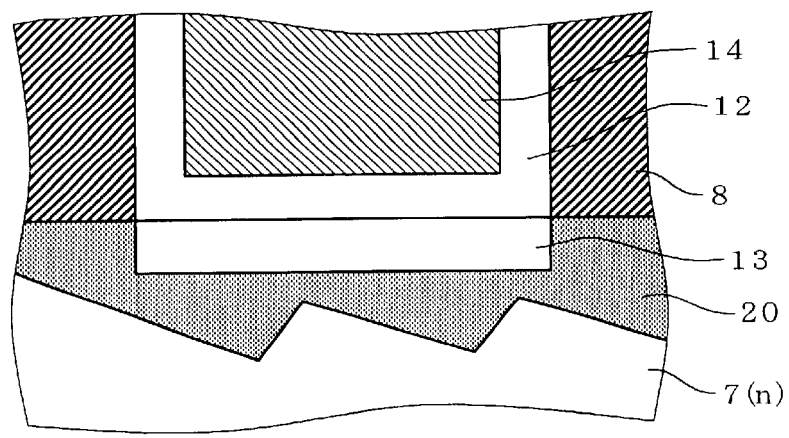
FIG. 32 is a partially enlarged view of FIG. 31.
Figure 33:
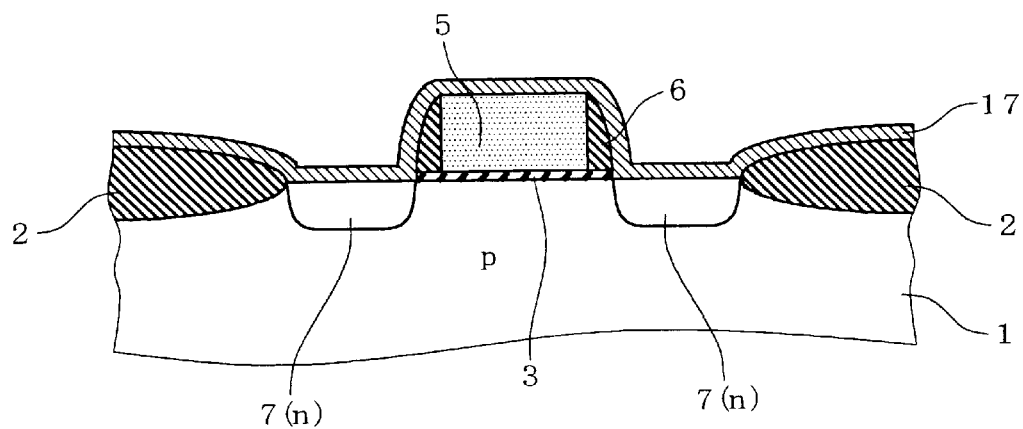

FIG. 32 illustrates a part I of FIG. 31 in an enlarged manner. As shown in FIG. 32, each silicide layer 20 is formed with an epitaxial growth layer, while each silicide layer 13 is formed with no epitaxial growth layer. Further, irregularities are formed on the interface between the epitaxial growth layer and the semiconductor layer 7. Thus, the silicide layer 20 including the epitaxial layer having irregularities is widely formed beyond the region located immediately under the contact hole 9 in the semiconductor device 103, whereby the contact area SA is further increased. Consequently, the contact resistance between the main electrode 14 and the semiconductor layer 7 is further effectively reduced.

FIGS. 33 to 41 illustrate steps of a method of manufacturing the semiconductor device 103. In order to manufacture the semiconductor device 103, steps similar to those shown in FIGS. 3 to 8 are first carried out for thereafter carrying out the step shown in FIG. 33. In the step shown in FIG. 33, a metal film 17 is formed to cover overall surfaces exposed over a major surface of a semiconductor substrate 1. The metal film 17 is prepared from titanium or cobalt, for example. The metal film 17 is formed by sputtering, for example.

Figure 34:
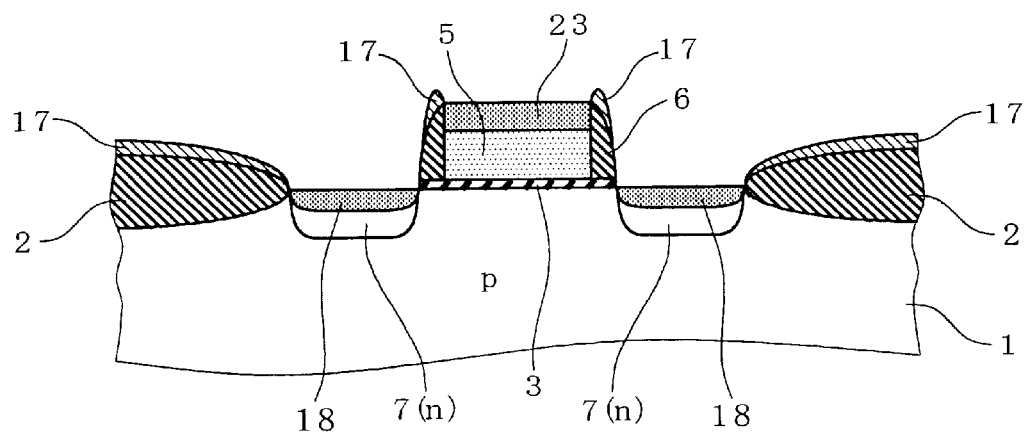

Then, the step shown in FIG. 34 is carried out. In the step shown in FIG. 34, lamp annealing (hereinafter referred to as first lamp annealing) is performed. The first lamp annealing is performed at a heating temperature of 400° C. to 600° C. for a heating time of not more than 5 minutes. Thus, silicide layers 18 are formed. The silicide layers 18 are rich in metal (consisting of $Co_2Si$ or CoSi, for example, containing a large amount of a Co component, which is a metal), and have high resistivity.

The silicide layers 18 are selectively formed in regions of the surfaces of the semiconductor layers 7 exposed on the major surface of the semiconductor substrate 1 corresponding to openings for selectively implanting an n-type impurity, i.e., regions held between side walls 6 and element isolation layers 2. Further, a silicide layer 23 is formed in an exposed upper surface of a gate electrode 5. The metal film 17 is not reactive with the element isolation layers 2 and the side walls 6, and hence unreacted material parts remain on the surfaces thereof.

Figure 35:
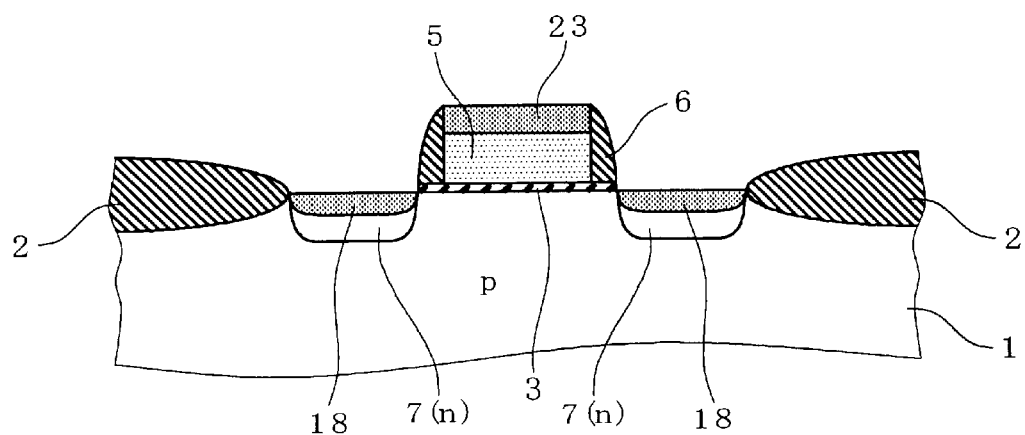
Figure 36:
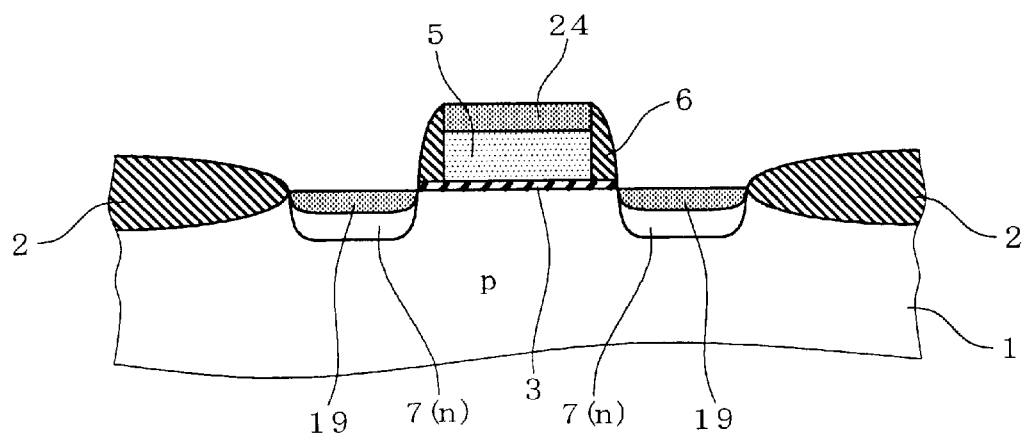

In the step shown in FIG. 35, the unreacted parts of the metal film 17 are selectively removed. The unreacted parts of the metal film 17 are removed by wet etching with an etching solution not dissolving the silicide layers 18, for example. Thereafter the step shown in FIG. 36 is carried out. In the step shown in FIG. 36, lamp annealing (hereinafter referred to as second lamp annealing) is performed.

The second lamp annealing is performed at a heating temperature of 700° C. to 1000° C. for a heating time of not more than 5 minutes. Thus, the silicide layers 18 are chemically converted into silicide layers 19 having low resistivity and containing a small amount of metal components (made of $CoSi_2$, for example). The silicide layers 19 are still mismatched with the semiconductor substrate 1 in crystal structure, and the interfaces thereof are flat. In other words, the first and second lamp annealing corresponds to a first heat treatment on the silicide layers 19.

Figure 39:
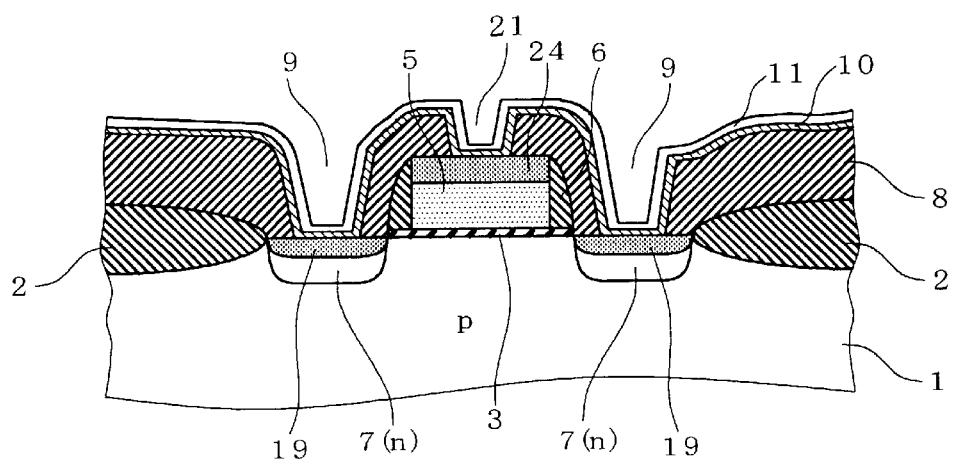

Then, an insulator layer 8 is formed to cover the overall surfaces exposed over the semiconductor substrate 1 as shown in FIG. 37, similarly to the step shown in FIG. 9. Then, the contact holes 9 and 21 are selectively formed as through holes on the portions of the insulator layer 8 located immediately above the silicide layers 19 and 24, as shown in FIG. 38. Then, a metal film 10 and a barrier film 11 are formed to cover the overall surfaces exposed over the major surface of the semiconductor substrate 1 as shown in FIG. 39, similarly to the step shown in FIG. 11.

Figure 40:
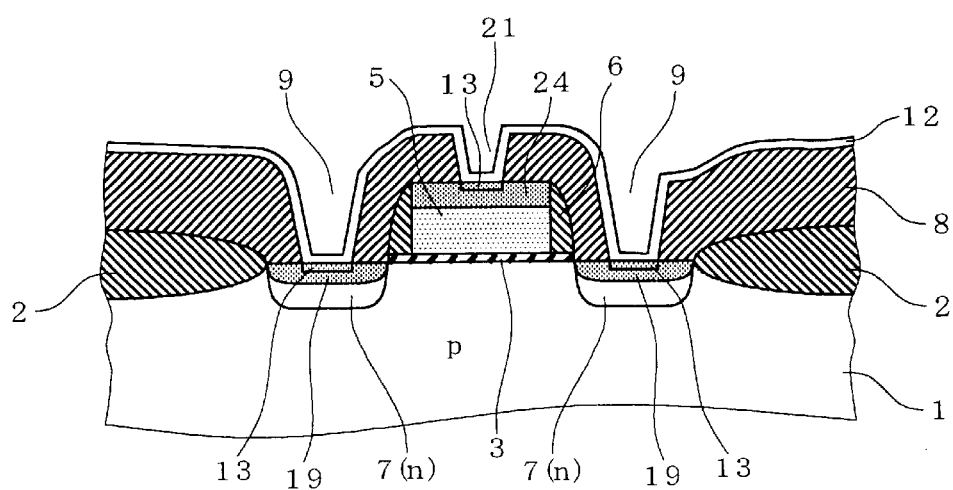
Figure 41:
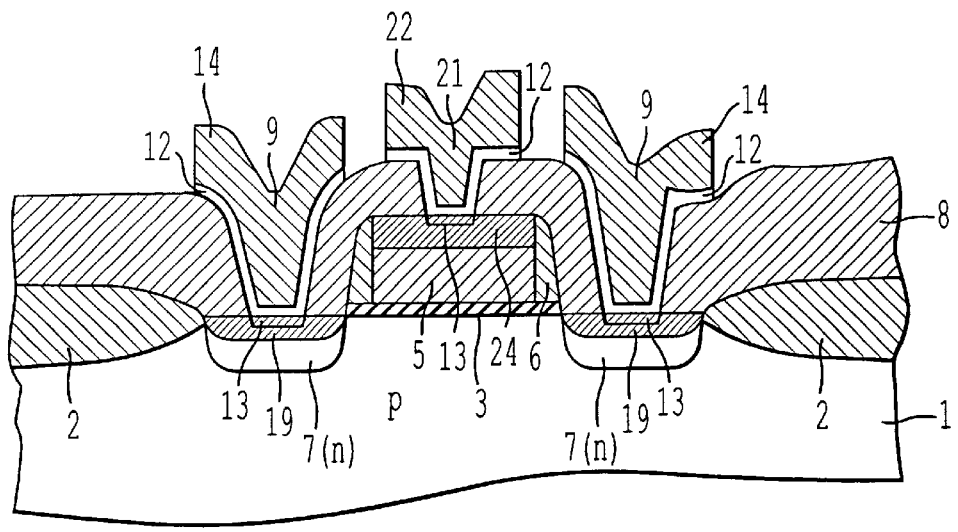
Figure 42:
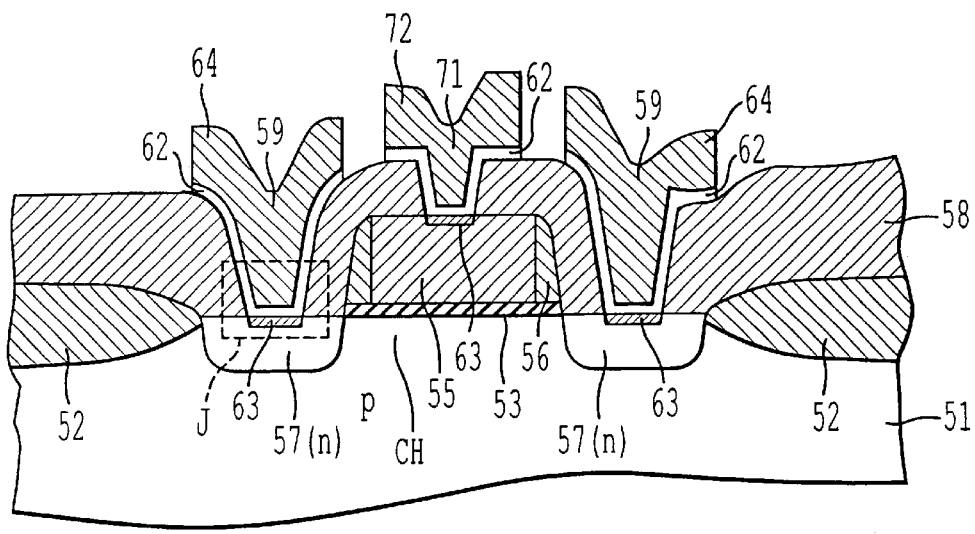
FIG. 42 is a front sectional view of a conventional semiconductor device.
Figure 43:
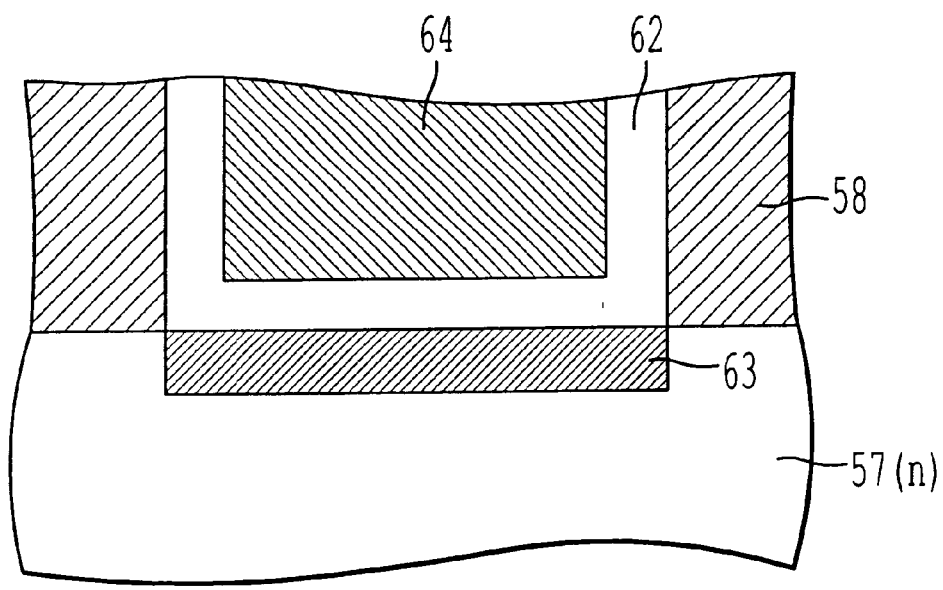
FIG. 43 is a partially enlarged view of FIG. 42.

Then, the step shown in FIG. 40 is carried out. In the step shown in FIG. 40, a heat treatment is performed in the temperature range of 400° C. to 800° C. Consequently, the barrier film 11 and the metal film 10 are integrated with each other to form a barrier layer 12. At the same time, silicide layers 13 are formed on the interfaces between the barrier layer 12 and the silicide layers 19. This heat treatment corresponds to a first heat treatment on the silicide layers 13. Thereafter the contact holes 9 and 21 are charged with a conductive material for forming the main electrodes 14 and the gate wire 22, as shown in FIG. 41.

Referring again to FIG. 31, a second heat treatment is performed on the silicide layers 19 in the temperature range of 600° C. to 850° C. for a heating time of at least 30 minutes. Consequently, the silicide layers 19 epitaxially grow to form silicide layers 20. Thus, the silicide layers 20 are widely formed over the regions of the semiconductor layers 7 exposed in the openings for implanting the impurity contained therein beyond the regions located immediately under the contact holes 9.

Similarly to the embodiment 1, the second heat treatment may be performed in any stage after formation of the silicide layers 19 through the first heat treatment. The semiconductor device 103 is completed through the aforementioned steps.

<5. Modifications>

(1) While the semiconductor substrate 1 is mainly composed of silicon, i.e., the same is a silicon substrate in each of the aforementioned embodiments, the present invention is generally applicable to a semiconductor device comprising a semiconductor substrate mainly composed of an element other than silicon. Numerical conditions for the second heat treatment or the like are generally individually set in response to the material for the semiconductor substrate.

(2) While the semiconductor device comprises an n-channel MOSFET in each of the aforementioned embodiments, the present invention is also applicable to a semiconductor device comprising a p-channel MOSFET. The present invention is further generally applicable not only to a semiconductor device comprising a MOSFET but also to a semiconductor device having a silicide layer (a metal semiconductor compound layer, in general) interposed between a semiconductor substrate having a single-crystalline structure and an electrode.

While the invention has been shown and described in detail, the foregoing description is in all aspects illustrative and not restrictive. It is therefore understood that numerous modifications and variations can be devised without departing from the scope of the invention.

I claim:

1. A method of manufacturing a semiconductor device comprising the steps of:
   (a) forming a metal film on a part of a major surface of a semiconductor substrate;
   (b) forming a silicide layer on said part by performing a first heat treatment;
   (c) selectively epitaxially growing at least a part of said silicide layer into said semiconductor substrate in a directions perpendicular to low index planes of the silicide layer and inclined against said major surface by performing a second heat treatment; and
   (d) connecting an electrode to said part of said major surface after said step (a).

2. The method of manufacturing a semiconductor device according to claim 1, further comprising preparing a semiconductor substrate mainly composed of silicon as said semiconductor substrate, wherein said step (c) includes the step of:

(c1) performing heating at a temperature of at least 600° C. and not more than 850° C. for at least 30 minutes as said second heat treatment.

3. The method of manufacturing a semiconductor device according to claim 2, further comprising the step of performing heating at a temperature not lower than 800° C. for not more than 1 minute between steps (b) and (c).

4. The method of manufacturing a semiconductor device according to claim 1, further comprising the steps of:

(e) selectively forming a semiconductor layer in said major surface by selectively introducing an impurity into said major surface before said step (a), (f) forming an insulator layer on said major surface after said step (e) and before said step (a), (g) forming a contact hole selectively opening on said semiconductor layer in said insulator layer before said step (a), and (h) selectively forming another semiconductor layer in said major surface to be identical in conductivity type to said semiconductor layer and deeper than said semiconductor layer by selectively introducing an impurity into said major surface through said contact hole before said step (a), said step (a) includes the step of:

(a-1) forming said metal film on a surface of said semiconductor layer exposed in said contact hole and on an inner wall surface of said contact hole, and said step d includes the step of:

(d-1) forming said electrode in said contact hole by charging said contact hole with a material for said electrode.

5. The method of manufacturing a semiconductor device according to claim 1, further comprising the steps of:

(e) selectively forming a semiconductor layer in said major surface by selectively introducing an impurity into said major surface before said step (a), (f) forming an insulator layer on said major surface after said step (e) and before said step (a), (g) forming a contact hole selectively opening on said semiconductor layer in said insulator layer before said step (a), and (h) selectively forming an element isolation layer in said major surface before' said step (e), said step (a) includes the step of:

(a-1) forming said metal film on a surface of said semiconductor layer exposed in said contact hole and on an inner wall surface of said contact hole, said step (d) includes the step of:

(d-1) forming said electrode in said contact hole by charging said contact hole with a material for said electrode, said step (e) includes the step of:

(e-1) forming said semiconductor layer by selectively introducing said impurity into said major surface while employing said element isolation layer as a screen, and said step (g) includes the step of:

(g-1) forming said contact hole on a portion apart from immediately above said element isolation layer.

6. The method of manufacturing a semiconductor device according to claim 1, further comprising the steps of:

(e) forming a screen selectively defining an opening in a region of said major surface corresponding to said part on said major surface before said step (a), and (f) selectively forming a semiconductor layer in said major surface by selectively introducing an impurity into said major surface through said opening before said step (a).

7. The method of manufacturing a semiconductor device according to claim 4, wherein said step (d) is carried out after said step (b), said method further comprising the step of:

(i) removing an unreacted part of said metal film after said step (b) and before said step (d).

8. The method of manufacturing a semiconductor device according to claim 5, wherein said step (d) is carried out after said step (b), said method further comprising the step of:

(i) removing an unreacted part of said metal film after said step (b) and before said step (d).

* * * * *